(12) United States Patent
Arai

(10) Patent No.: US 9,748,268 B1
(45) Date of Patent: Aug. 29, 2017

(54) SEMICONDUCTOR MEMORY DEVICE

(71) Applicant: Kabushiki Kaisha Toshiba, Minato-ku (JP)

(72) Inventor: Shinya Arai, Yokkaichi (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 15/408,952

(22) Filed: Jan. 18, 2017

Related U.S. Application Data

(60) Provisional application No. 62/384,352, filed on Sep. 7, 2016.

(51) Int. Cl.
| | |
|---|---|
| *H01L 27/115* | (2017.01) |
| *H01L 29/06* | (2006.01) |
| *H01L 27/11582* | (2017.01) |
| *H01L 27/1157* | (2017.01) |
| *H01L 21/311* | (2006.01) |
| *H01L 21/28* | (2006.01) |
| *H01L 21/3213* | (2006.01) |
| *H01L 29/10* | (2006.01) |
| *H01L 29/423* | (2006.01) |

(52) U.S. Cl.
CPC .. *H01L 27/11582* (2013.01); *H01L 21/28282* (2013.01); *H01L 21/31116* (2013.01); *H01L 21/32135* (2013.01); *H01L 27/1157* (2013.01); *H01L 29/0657* (2013.01); *H01L 29/1033* (2013.01); *H01L 29/4234* (2013.01)

(58) Field of Classification Search
CPC ......... H01L 27/11582; H01L 27/11568; H01L 27/1157; H01L 27/11575
See application file for complete search history.

(56) References Cited

U.S. PATENT DOCUMENTS

| | | | |
|---|---|---|---|
| 6,555,397 B1 | 4/2003 | Bonser et al. | |
| 9,093,370 B2 | 7/2015 | Hwang | |
| 2011/0180866 A1* | 7/2011 | Matsuda | H01L 27/11573 257/324 |
| 2013/0234338 A1 | 9/2013 | Uenaka et al. | |

(Continued)

FOREIGN PATENT DOCUMENTS

| | | |
|---|---|---|
| JP | 4-96225 | 3/1992 |
| JP | 3143134 | 3/2001 |

(Continued)

*Primary Examiner* — Christine Enad
(74) *Attorney, Agent, or Firm* — Oblon, McClelland, Maier & Neustadt, L.L.P.

(57) ABSTRACT

A semiconductor memory device including a first electrode layer provided on a conductive layer; a second electrode layer provided between the conductive layer and the first electrode layer; a first insulating layer provided between the first electrode layer and the second electrode layer; and a pillar layer extending through the first electrode, the second electrode and the first insulating layer in a first direction directed from the conductive layer to the first electrode layer. The pillar layer includes a first portion extending through the first insulating layer and a second portion extending through the second electrode layer. The pillar layer has a first width in a second direction along a surface of the conductive layer at a periphery of the first portion, and a second width in the second direction at a periphery of the second portion. The second width is wider than the first width.

9 Claims, 23 Drawing Sheets

(56) References Cited

U.S. PATENT DOCUMENTS

| | | | |
|---|---|---|---|
| 2015/0008503 A1* | 1/2015 | Makala | H01L 27/11582 |
| | | | 257/324 |
| 2015/0069489 A1 | 3/2015 | Higuchi et al. | |
| 2015/0140753 A1* | 5/2015 | Simsek-Ege | H01L 27/1157 |
| | | | 438/268 |
| 2015/0206897 A1 | 7/2015 | Kuniya | |
| 2016/0284808 A1* | 9/2016 | Yang | H01L 29/42372 |
| 2017/0062468 A1* | 3/2017 | Son | H01L 27/11582 |

FOREIGN PATENT DOCUMENTS

| | | |
|---|---|---|
| JP | 2004-509463 | 3/2004 |
| JP | 3593965 | 11/2004 |
| JP | 2013-98563 | 5/2013 |
| JP | 2013-187339 | 9/2013 |
| JP | 2015-056444 A | 3/2015 |
| JP | 2015-138834 | 7/2015 |

\* cited by examiner

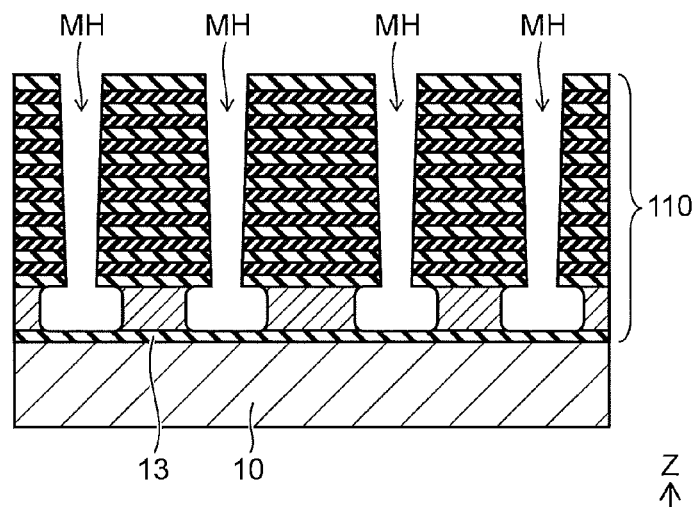
FIG. 3C
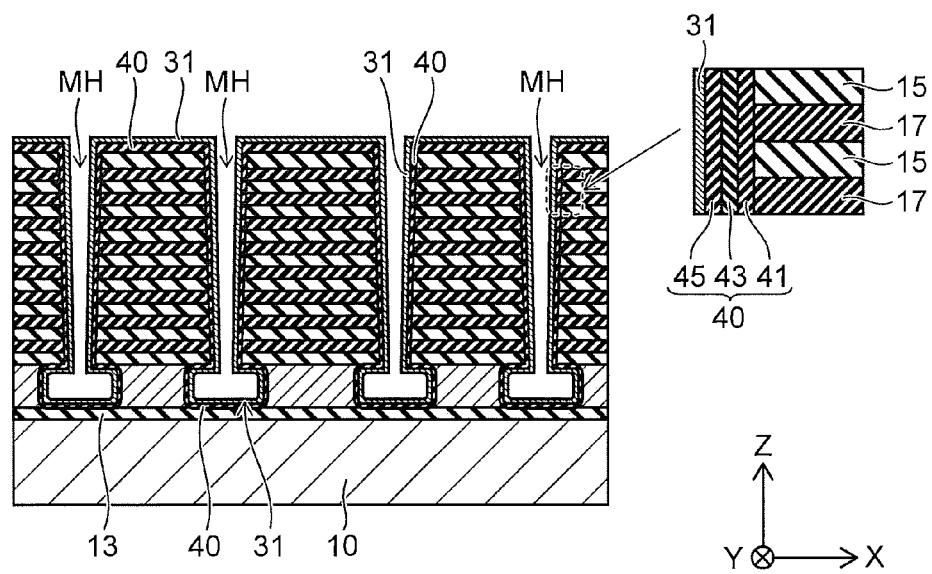
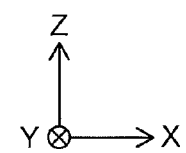
FIG. 3D

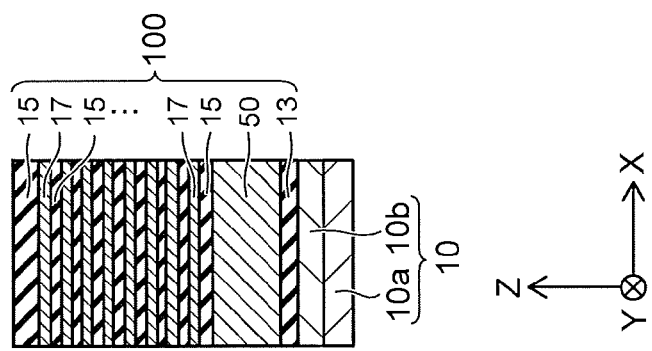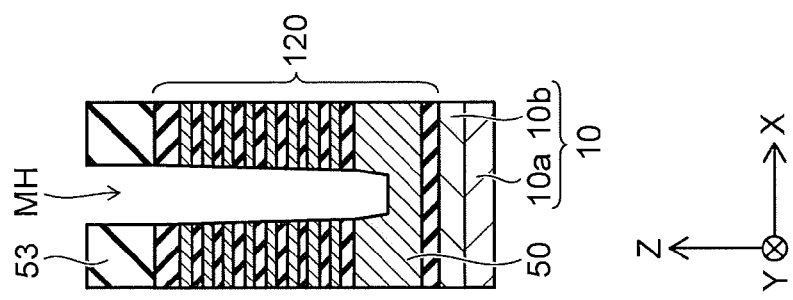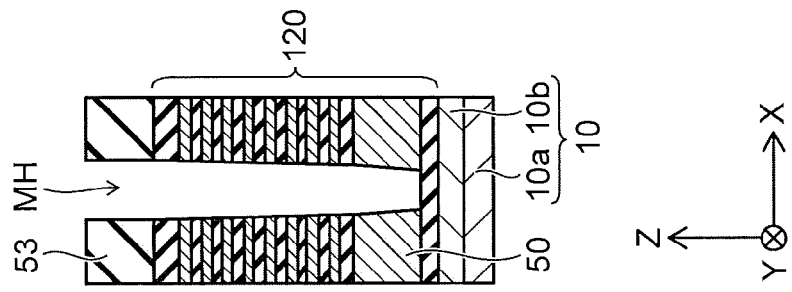

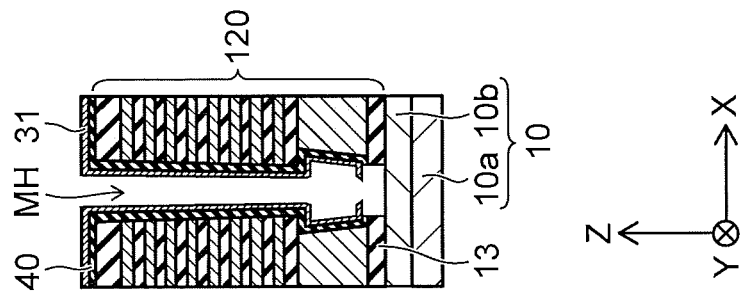
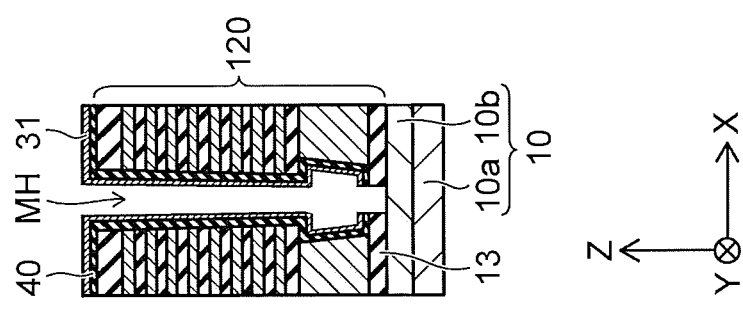
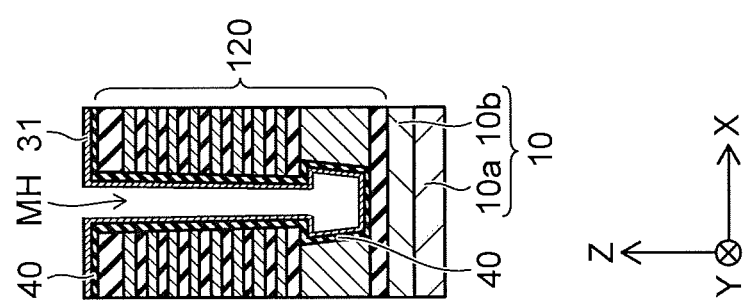
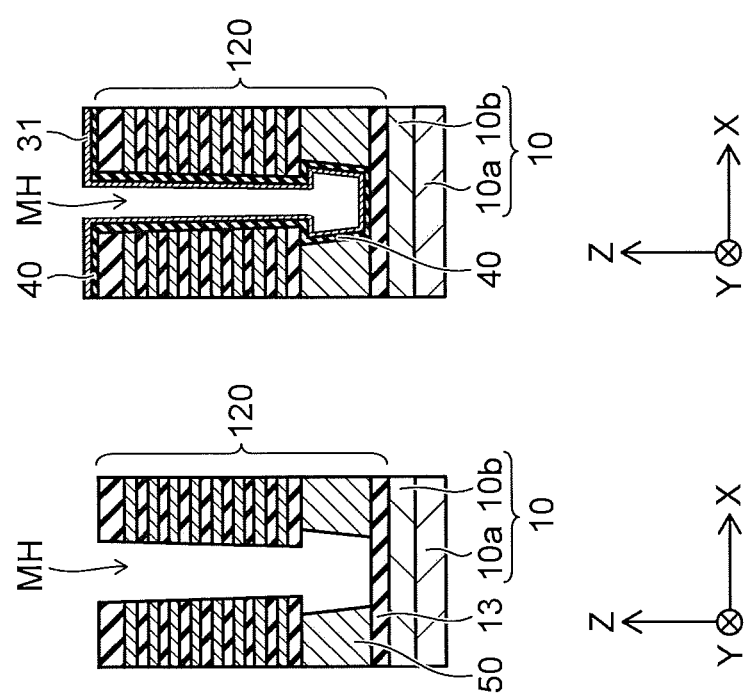

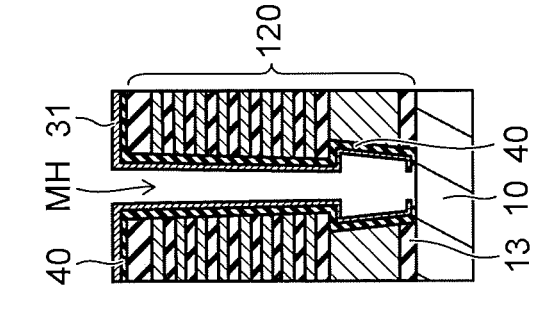

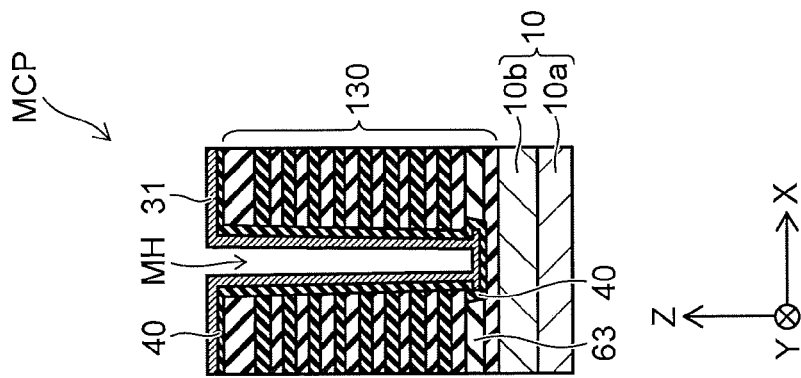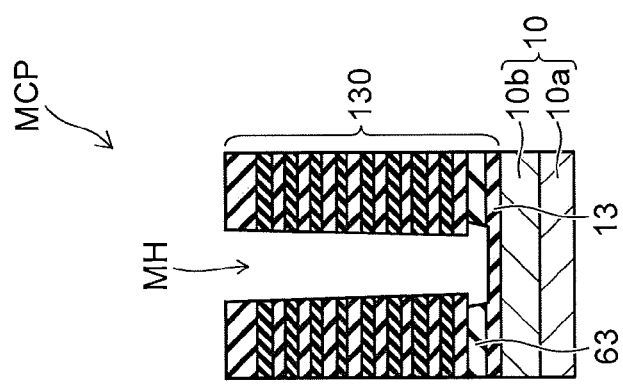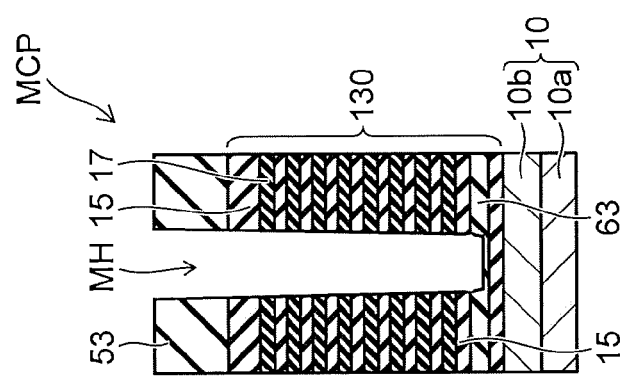

SEMICONDUCTOR MEMORY DEVICE

CROSS-REFERENCE TO RELATED APPLICATIONS

This application is based upon and claims the benefit of priority from U.S. Provisional Patent Application 62/384,352 filed on Sep. 7, 2016; the entire contents of which are incorporated herein by reference.

FIELD

Embodiments are generally related to a semiconductor memory device.

BACKGROUND

A non-volatile semiconductor memory device is under development, which includes three-dimensionally disposed memory cells. NAND-type semiconductor memory device, for example, has a memory cell part which includes a plurality of word lines stacked on a source layer and a semiconductor channel body extending therethrough. To enlarge the memory capacity of such a semiconductor memory device, it is effective to increase the number of the word lines stacked. However, it may be difficult to control a position of the bottom end of the semiconductor channel body, when increasing the number of the word lines stacked and providing the semiconductor channel body that extends through the word lines and reaches the source layer.

BRIEF DESCRIPTION OF THE DRAWINGS

FIGS. 3A to 3L are schematic cross-sectional views showing a manufacturing process of the semiconductor memory device according to the first embodiment;

FIGS. 6A to 6G are schematic cross-sectional views showing a manufacturing process of the semiconductor memory device according to the variation of the first embodiment;

FIGS. 7A to 7D are schematic cross-sectional views showing a manufacturing process of a semiconductor memory device according to another variation of the first embodiment;

FIGS. 9A to 9J are schematic cross-sectional views showing a manufacturing process of the semiconductor memory device according to the second embodiment;

DETAILED DESCRIPTION

Figure 1:
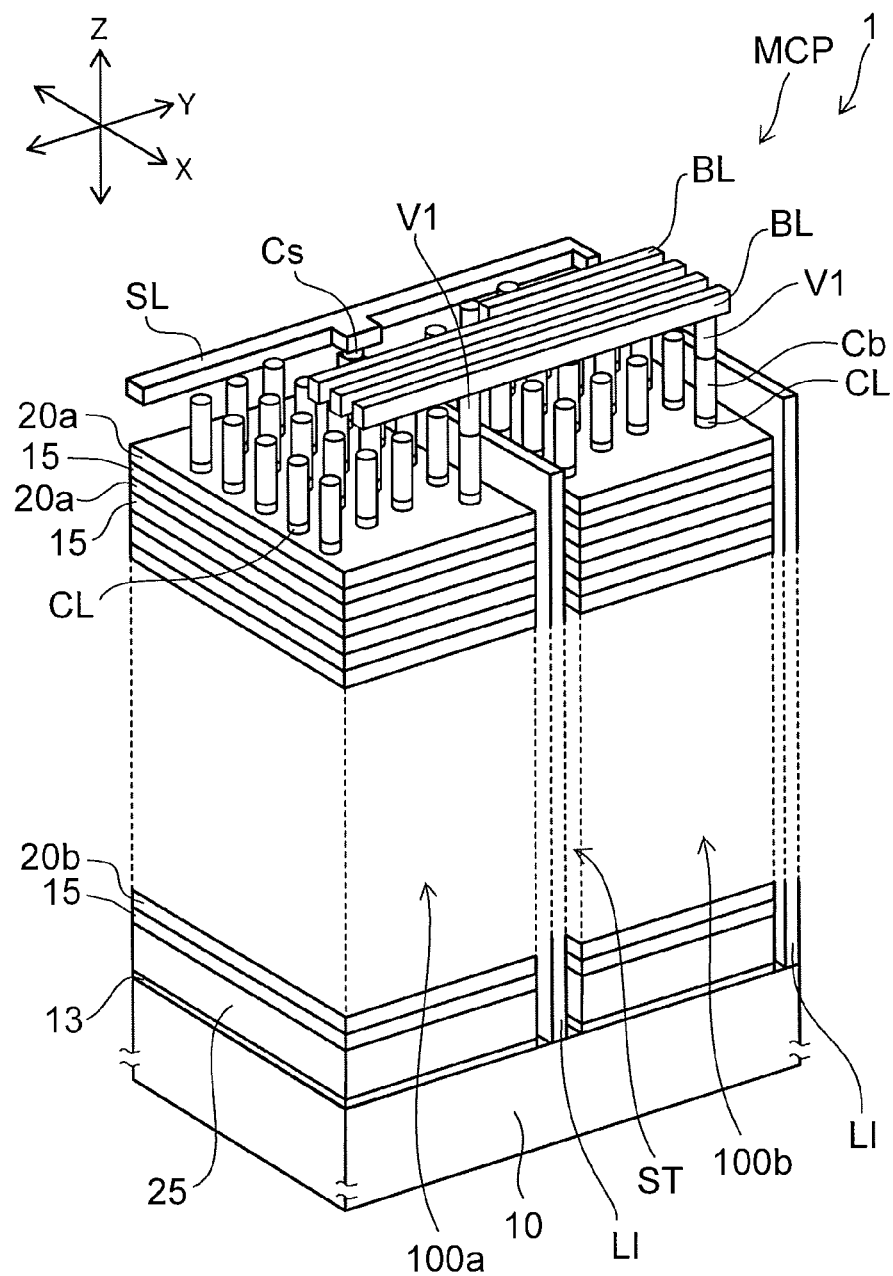
FIG. 1 is a perspective view schematically showing a semiconductor memory device according to a first embodiment.

According to one embodiment, a semiconductor memory device including a first electrode layer provided on a conductive layer; a second electrode layer provided between the conductive layer and the first electrode layer; a first insulating layer provided between the first electrode layer and the second electrode layer; and a pillar layer extending through the first electrode, the second electrode and the first insulating layer in a first direction directed from the conductive layer to the first electrode layer. The pillar layer has conductivity, and includes a first portion extending through the first insulating layer and a second portion extending through the second electrode layer. The pillar layer has a first width in a second direction along a surface of the conductive layer at a periphery of the first portion, and a second width in the second direction at a periphery of the second portion. The second width is larger than the first width.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically showing a memory cell part of a semiconductor memory device 1 according to a first embodiment. The semiconductor memory device is, for example, a NAND-type non-volatile memory device, and includes memory cells disposed three-dimensionally.

As shown in FIG. 1, the semiconductor memory device 1 includes a conductive layer (hereinafter, a source layer 10), a stacked body 100a and a stacked body 100b. The stacked bodies 100a and 100b are arranged side by side in the Y-direction on the source layer 10. The stacked bodies 100a and 100b each include a plurality of insulating layers 15, a plurality of electrode layers 20 and an electrode layer 25, which are stacked on the source layer with an insulating layer 13 interposed.

The electrode layer 25 is provided on the source layer 10 with the insulating layer 13 interposed. The insulating layers 15 and the electrode layers 20 are alternately stacked on the electrode layer 25. An insulating layer 15 electrically isolates adjacent electrode layers 20 in a first direction (hereinafter, the Z-direction) from each other. The insulating layer 15, which locates at a position of the lowermost layer of the plurality of insulating layers 15, is provided between the electrode layer 25 and an electrode layer 20b that is the lowermost layer of the plurality of electrode layers 20, and electrically isolates the electrode layers 20b and 25 from each other.

The source layer 10 is, for example, a P-type well provided on a silicon substrate (not shown). Alternatively, the source layer 10 may be a silicon layer provided on a silicon substrate via an interlayer insulating layer (not shown). The insulating layers 15 are, for example, silicon oxide layers. The electrode layers 20 are, for example, metal layers that include tungsten (W). The electrode layer 25 is, for example, a conductive silicon layer.

Figure 2:
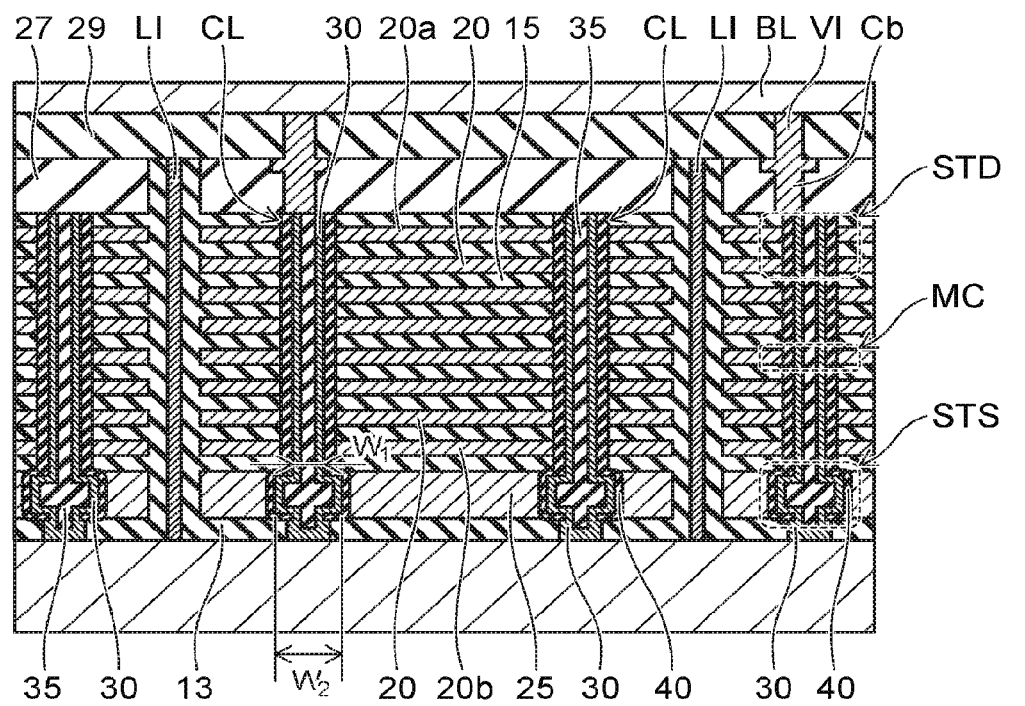
FIG. 2 is a schematic cross-sectional view showing the semiconductor memory device according to the first embodiment.

The stacked bodies 100a and 100b each include a plurality of columnar bodies CL, which extend in the Z-direction through the insulating layer 13, the electrode layer 25, the plurality of insulating layer 15 and the plurality of electrode layer 20 (see FIG. 2). The columnar bodies CL each include a conductive pillar layer (hereinafter, a semiconductor layer 30), and the semiconductor layer 30 is electrically connected to a bit line BL via contact plugs Cb and V1 (see FIG. 2). The bit line BL extends in the Y-direction above the stacked bodies 100a and 100b. One of the plurality of columnar bodies CL that are provided in the stacked body 100a shares one bit line BL with one of the plurality of columnar bodies CL that are provided in the stacked body 100b. It should be noted in FIG. 1 that insulating layers 27, 29 (see FIG. 2) provided between an electrode layer 20a, which is the uppermost layer of the plurality of electrode layers 20, and bit lines BL for convenience in showing a structure of the semiconductor memory device 1.

The semiconductor memory device 1 further includes a conductive body (hereinafter, a source contact body LI) electrically connected to the source layer 10 and a source line SL. The source contact body LI is provided between the stacked body 100a and the stacked body 100b. The source contact body LI is, for example, a plate-shaped metal body extending in the X-direction and the Y-direction. The source contact body LI is electrically connected to the source line SL via a contact plug Cs. That is, the source line SL is electrically connected via the source contact body LI to the source layer 10. The source line SL extends, for example, in the Y-direction above the stacked bodies 100a and 100b.

FIG. 2 is a schematic cross-sectional view showing the semiconductor memory device according to the first embodiment. FIG. 2 is a schematic view showing a cross section taken along the X-Z plane. Hereinafter, the structure of the semiconductor memory device 1 is described in detail with reference to FIG. 2.

The semiconductor memory device 1 includes the columnar bodies CL extending in the Z-direction through the insulating layer 13, the electrode layer 25, a plurality of insulating layers 15 and a plurality of electrode layers 20. The columnar bodies each include a semiconductor layer 30, an insulating layer 40 and a core body 35. The semiconductor layer 30 extends in the Z-direction in a columnar body CL. The insulating layer 40 is positioned between each of the electrode layers 20 and the semiconductor layer 30, and forms an outer shell of the columnar body CL. The semiconductor layer 30 is positioned between the insulating layer 40 and the core body 35. The core body 35 is an insulating body embedded in a center of the columnar body CL.

A selection transistor STS on a source side, for example, is provided at a part where the columnar body CL extends through the electrode layer 25. Memory cells MC and a selection transistor STD on a drain side, for example, are provided at parts respectively where the columnar body CL extends through the plurality of electrode layers 20. The selection transistor STD is provided at parts, for example, where the columnar body CL extends through the electrode layer 20a, which is the uppermost layer, and an electrode layer 20 adjacent thereto. The memory cells MC are provided at parts between the selection transistor STS and the selection transistor STD, where the columnar body CL extends through electrode layers 20.

The semiconductor layer 30 acts as channels of the memory cells MC, the selection transistors STS and STD. The electrode layer 25 acts as a selection gate of the selection transistor STS. The electrode layer 20a and the electrode layer 20 adjacent thereto act as selection gates of the selection transistor STD. The electrode layers 20 positioned between the electrode layer 20 adjacent to the electrode layer 20a and the electrode layer 25 act as control gates of the memory cells MC.

The insulating layer 40 has, for example, an ONO structure in which a silicon oxide, a silicon nitride and another silicon oxide are stacked in order in a direction from an electrode layer 20 toward the semiconductor layer 30. The insulating layer 40 acts as charge storage portions of the memory cells MC at parts positioned between the electrode layers 20 and the semiconductor layer 30.

As described above, the semiconductor memory device 1 includes a NAND string, which includes the plurality of memory cells MC, the selection transistors STS and STD disposed along the semiconductor layer 30 extending in the Z-direction.

Furthermore, in the embodiment, the semiconductor layer 30 has a first width W1 in a direction along a surface of the source layer 10 (e.g. the X-direction) at an outer periphery of a part that extends through an insulating layer 15 positioned between the electrode layer 20b, which is the lowermost layer, and the electrode layer 25. Moreover, the semiconductor layer 30 has a second width W2 in the X-direction at an outer periphery of a part that extends through the electrode layer 25. Then, the semiconductor layer 30 is formed to have the second width W2 wider than the first width W1.

Thereby, it is possible to avoid the semiconductor layer 30 not reaching the source layer 10 due to an end formed to be thin on the source layer 30 side as described below, when a stacked body 100 has a large height in the Z-direction by increasing the number of the electrode layers 20 stacked, for example. Hereinafter, the stacked bodies 100a and 100b are described as a stacked body 100 without making distinction therebetween.

Then, a manufacturing method of the semiconductor memory device 1 is described with reference to FIGS. 3A to 3H. FIGS. 3A to 3H are schematic cross-sectional views showing a manufacturing process of the semiconductor memory device 1 according to the embodiment.

Figure 3A:
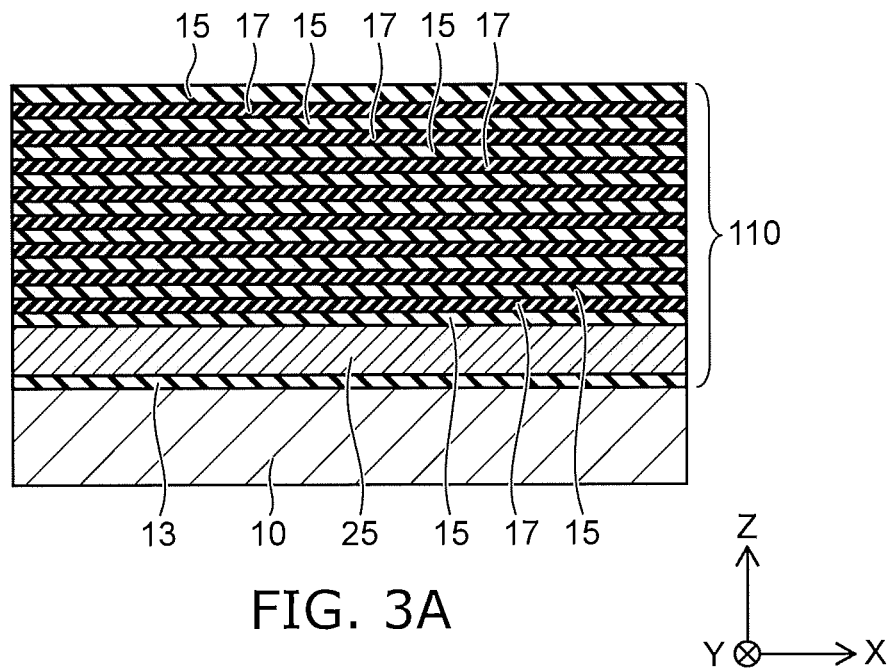

As shown in FIG. 3A, a stacked body 110 is formed on the source layer. The stacked body 110 includes an insulating layer 13, an electrode layer 25, a plurality of insulating layers 15 and a plurality of insulating layers 17. The insulating layer 13 is formed on the source layer 10. The electrode layer 25 is formed on the insulating layer 13. The insulating layers 15 and the insulating layers 17 are alternately stacked on the electrode layer 25.

The insulating layers 13 and 15 are, for example, silicon oxide layers. The insulating layers 17 are, for example, silicon nitride layers. The insulating layers 13, 15 and 17 are formed, for example, using CVD (Chemical Vapor Deposition) The electrode layer 25 is, for example, a conductive silicon layer that is deposited using CVD. The electrode layer 25 is, for example, a polycrystalline silicon layer containing Boron (B), which is a P-type impurity.

Figure 3B:
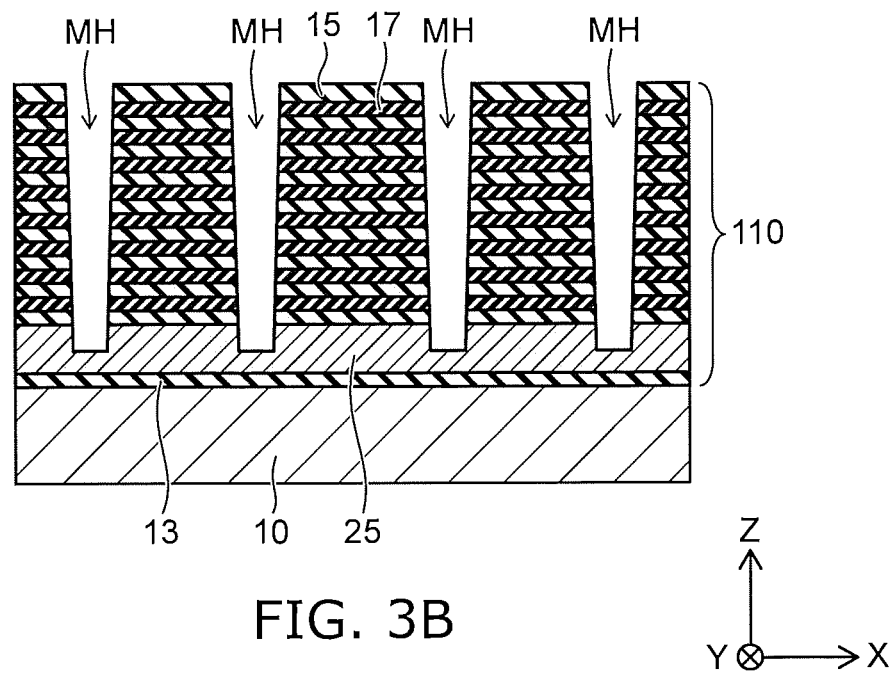

As shown in FIG. 3B, memory holes MH are formed from a top surface of the stacked body 110 with a depth capable of reaching the electrode layer 25. The memory holes MH are formed by selectively removing the insulating layers 15 and 17, for example, using anisotropic RIE.

The memory holes MH are formed so that the bottom surfaces thereof are positioned in the electrode layer 25. The insulating layers 15 and 17 are removed, for example, under a condition where etching rates thereof are faster than an etching rate of the electrode layer 25. The electrode layer 25 is formed to have a thickness capable of making an end of etching that proceeds into the electrode layer 25 through the stacked portion of the insulating layers 15 and 17. That is, it is possible to improve depth controllability of the memory holes MH by making the electrode layer 25 act as an etching stopper layer.

As shown in FIG. 3C, the electrode layer 25 is selectively etched at bottom portions of the memory holes MH, and the bottom portions of the memory holes MH are widened in the X-direction and the Y-direction. The electrode layer 25 is removed, for example, using CED (Chemical Dry Etching). The insulating layer 13 is exposed in the bottom surfaces of the memory holes MH.

As shown in FIG. 3D, an insulating layer 40 and a semiconductor layer 31 are formed to cover inner surfaces of the memory holes MH and the top surface of the stacked body 110. The insulating layer 40 is formed, for example, using CVD, and includes a first layer 41, a second layer 43 and a third layer 45. The first layer 41 is, for example, a silicon oxide layer, and is formed on an inner wall of each memory hole MH. The second layer 43 is, for example, a silicon nitride layer, and is formed on the first layer 41. The third layer 45 is, for example, a silicon oxide layer, and is formed on the second layer 43. The third layer 45 may include a high dielectric insulative body such as aluminum oxide, hafnium oxide and like. The semiconductor layer 31 is formed on the insulating layer 40, for example, using CVD. The semiconductor layer 31 is, for example, a silicon layer.

The memory holes MH are formed to have a tapered shape with a thin end on the source layer 10 side as shown in FIG. 3B. So, there may be a case where a memory hole MH is occluded at the bottom portion thereof with the insulating layer 40. In the embodiment, in order to avoid this occlusion, the bottom portions of the memory holes MH are widened by selectively etching the electrode layer 25. Thus, it is possible to keep a space for forming the semiconductor layer 30 at the bottom portion of each memory hole MH.

Figure 3E:
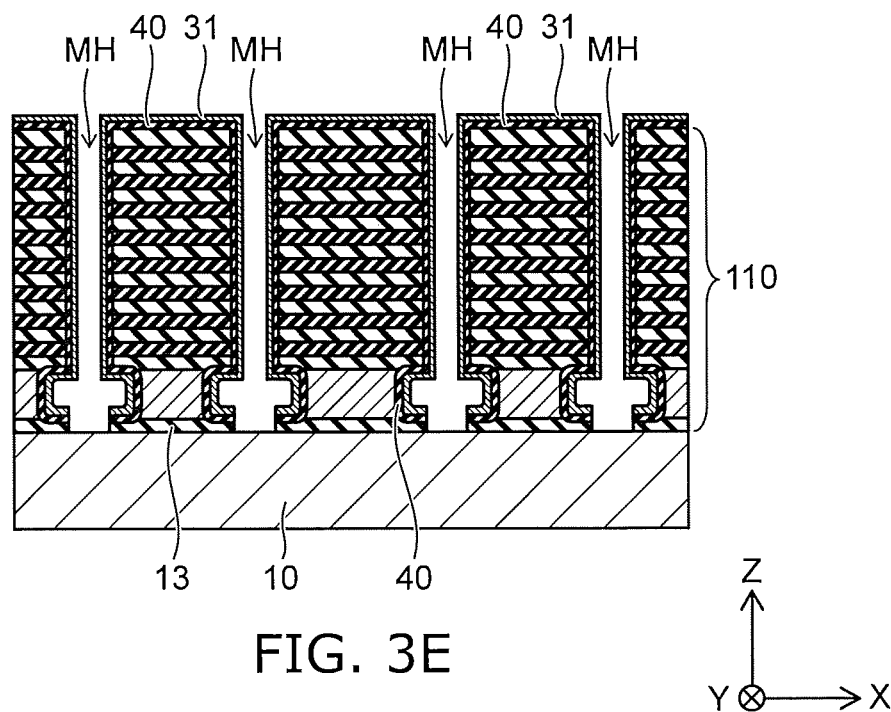

As shown in FIG. 3E, the semiconductor layer 31, insulating layer 40 and the insulating layer 13 are selectively removed at the bottom surface of each memory hole MH, and the source layer 10 is exposed. The semiconductor layer 31 and the insulating layer 40 is selectively removed, for example, using anisotropic RIE (Reactive Ion Etching) so that parts of the semiconductor layer 30 and the insulating layer 40 remain on the inner walls of the memory holes MH. Then, other parts of the semiconductor layer 31 and the insulating layer 40, which are formed on the top surface of the stacked body 110, are protected by a silicon nitride layer selectively formed thereon.

Figure 3F:
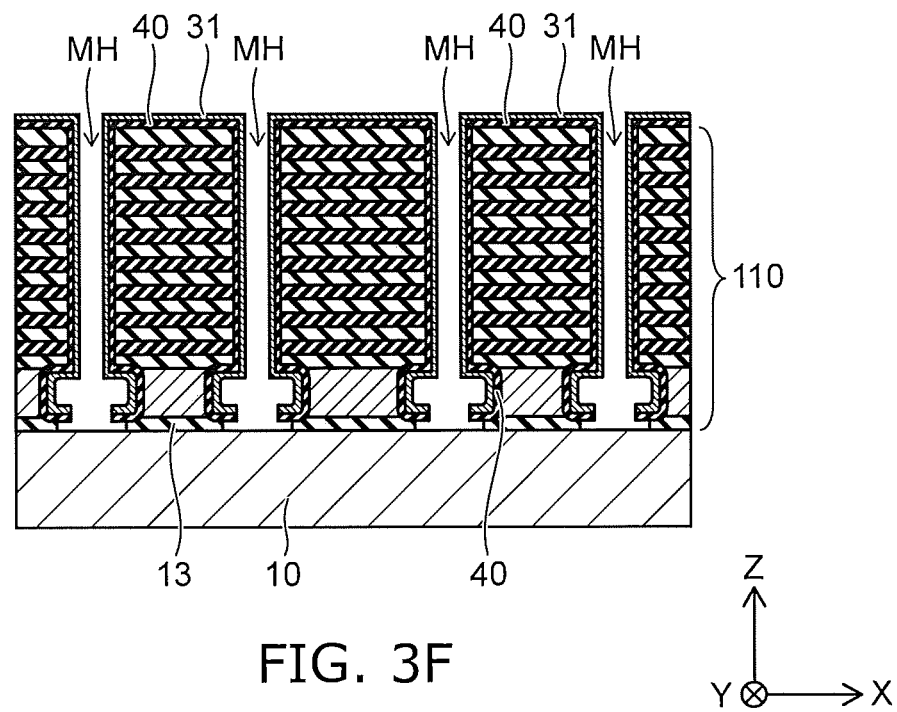

As shown in FIG. 3F, the bottom surfaces of the memory holes MH are widened in the X-direction and the Y-direction by selectively etching the insulating layer 13. In this process, parts of the insulating layer 13 are removed, for example, using wet etching. Thereby, it is possible to expose parts of the source layer 10, which are suffered no damages during the anisotropic RIE.

Figure 3G:
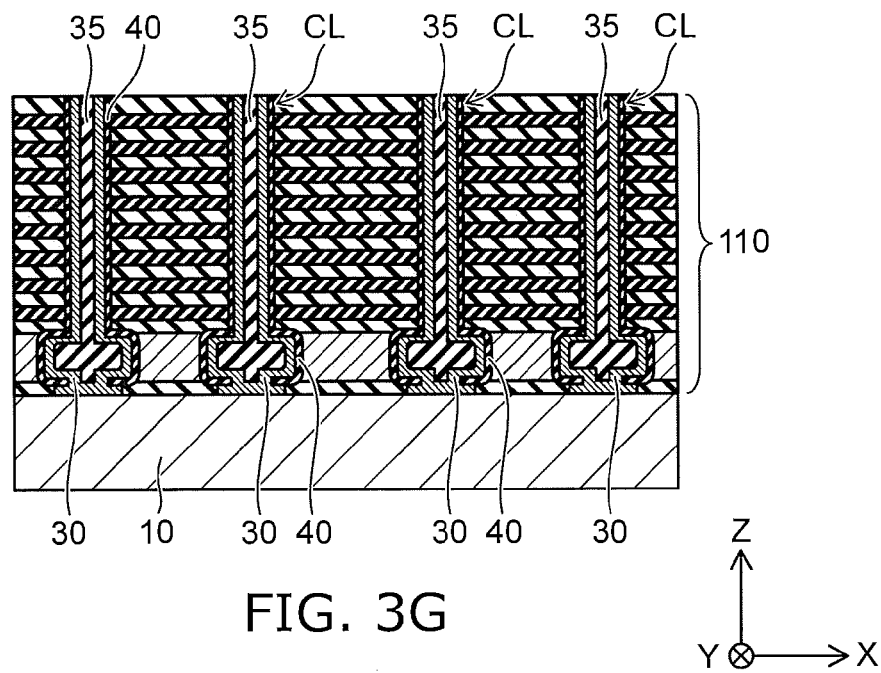

As shown in FIG. 3G, a semiconductor layer 30 and a core body 35 are formed in each memory hole MH, thereby completing columnar bodies CL. The semiconductor layer 30 is formed by forming a silicon layer on the semiconductor layer 31 and increasing a thickness thereof. The core body 35 is formed, for example, by embedding silicon oxide in each memory hole MH. Then, parts of the insulating layer 40 and the semiconductor layer 31 are removed, which are formed on the top surface of the stacked body 110.

Figure 3H:
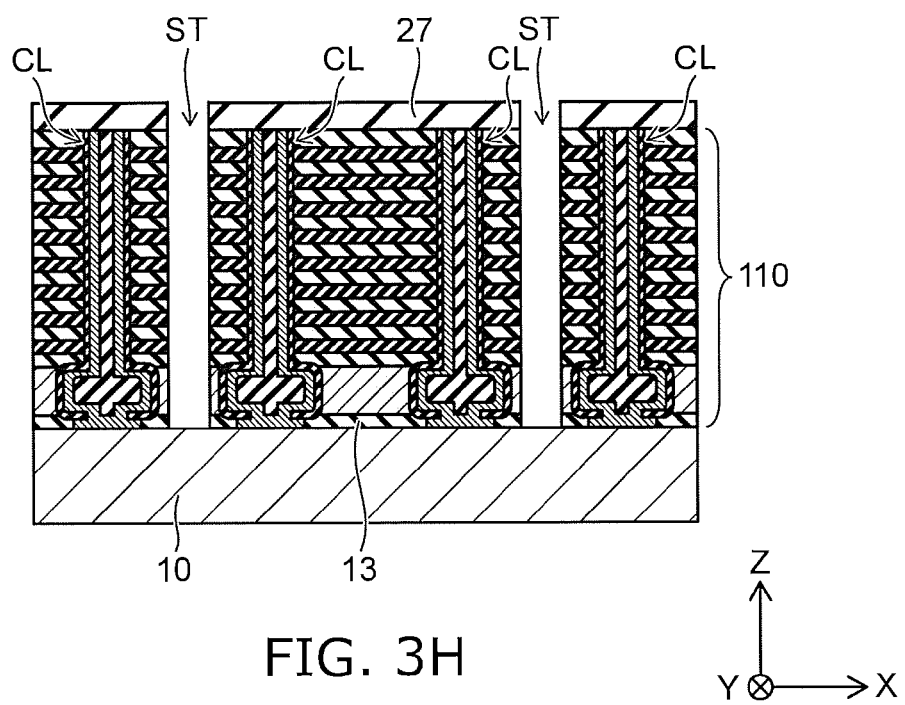

As shown in FIG. 3H, an insulating layer 27 is formed to cover the stacked body 110 and the columnar bodies CL. The insulating layer 27 is, for example, a silicon oxide formed using CVD. Further, slit spaces ST are formed from the insulating layer 27 to the source layer 10. The slit spaces ST are formed by selectively removing the insulating layer 27 and the stacked body 110, for example, using an isotropic RIE. The slit spaces ST divide the stacked body 110 into multiple parts each including a plurality of columnar bodies CL.

Figure 3I:
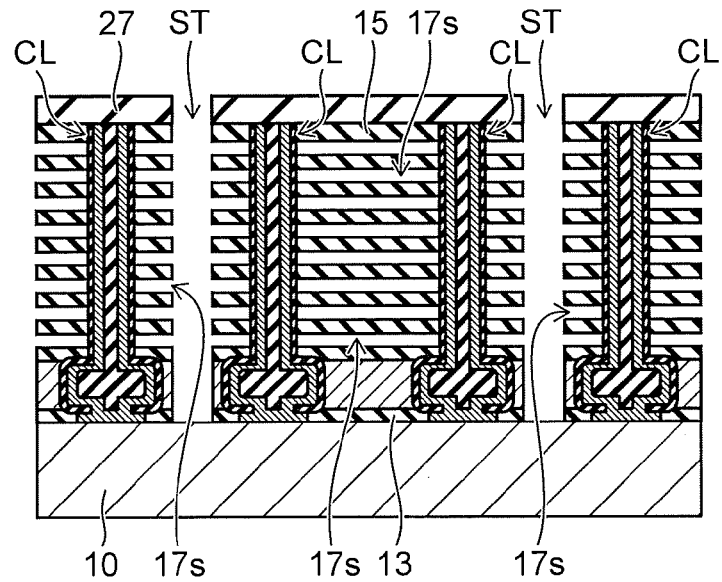

As shown in FIG. 3I, the insulating layers 17 are selectively removed using etching liquid supplied through the slit spaces ST. For example, in the case where the insulating layers 13, 15 and 17 are silicon oxide layer, and the insulating layers 17 are silicon nitride layers, it is possible to selectively remove the insulating layers 17 using hot phosphoric acid supplied as the etching liquid. In this process, the insulating layers 40 of the columnar bodies CL have resistivity against the etching liquid.

Figure 3J:
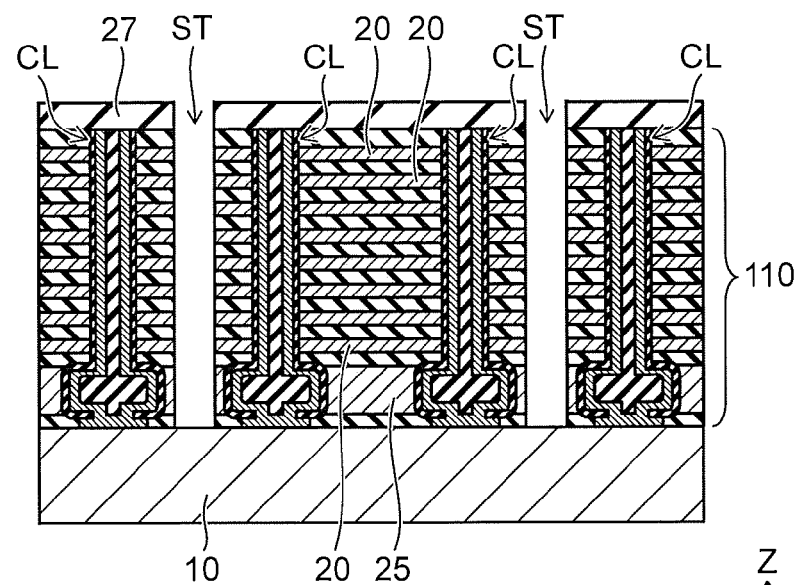

As shown in FIG. 3J, electrode layers 20 are formed in spaces 17s (see FIG. 3I), which are formed by removing the insulating layers 17, and thus, the stacked body 100 is completed. For example, metal layers are deposited in the spaces 17s using CVD, which are to be electrode layers 20. The electrode layers 20 each include, for example, barrier metal and high-melting-point metal such as tungsten. The barrier metal is, for example, titanium nitride (TiN), and is formed between each insulating layer 15 and the high-melting-point metal, and between the insulating layer 40 and the high-melting-point metal.

Figure 3K:
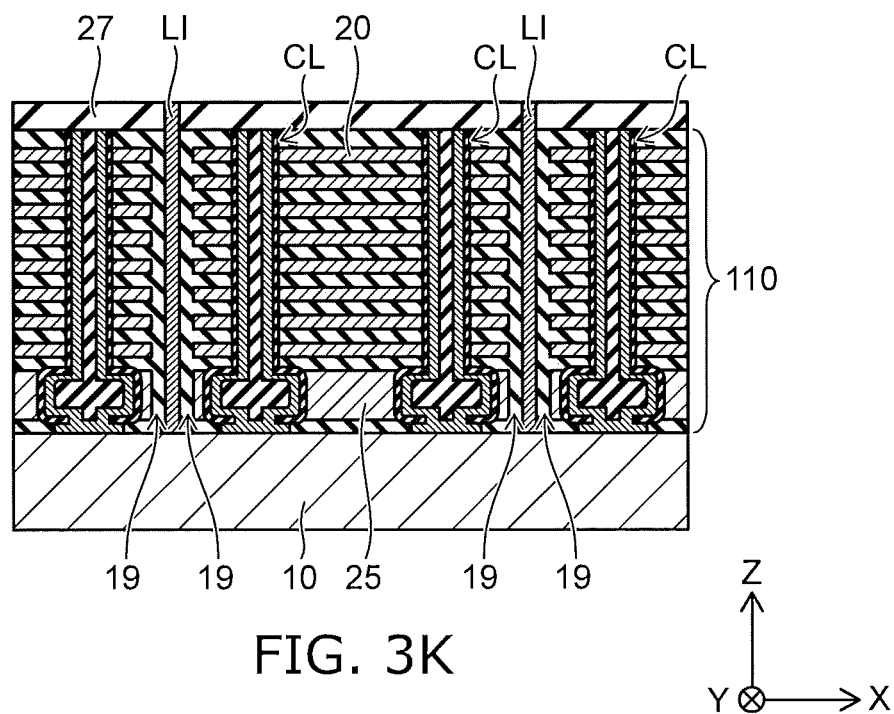

As shown in FIG. 3K, an insulating layer 19 is formed to cover inner walls of the slit spaces ST, and further, source contact bodies LI are formed in the slit spaces ST. The insulating layer 19 is, for example, a silicon oxide layer formed using CVD. The source contact bodies LI are formed, for example, using CVD, and has a stacked structure of barrier metal and high-melting-point metal such as tungsten.

Figure 3L:
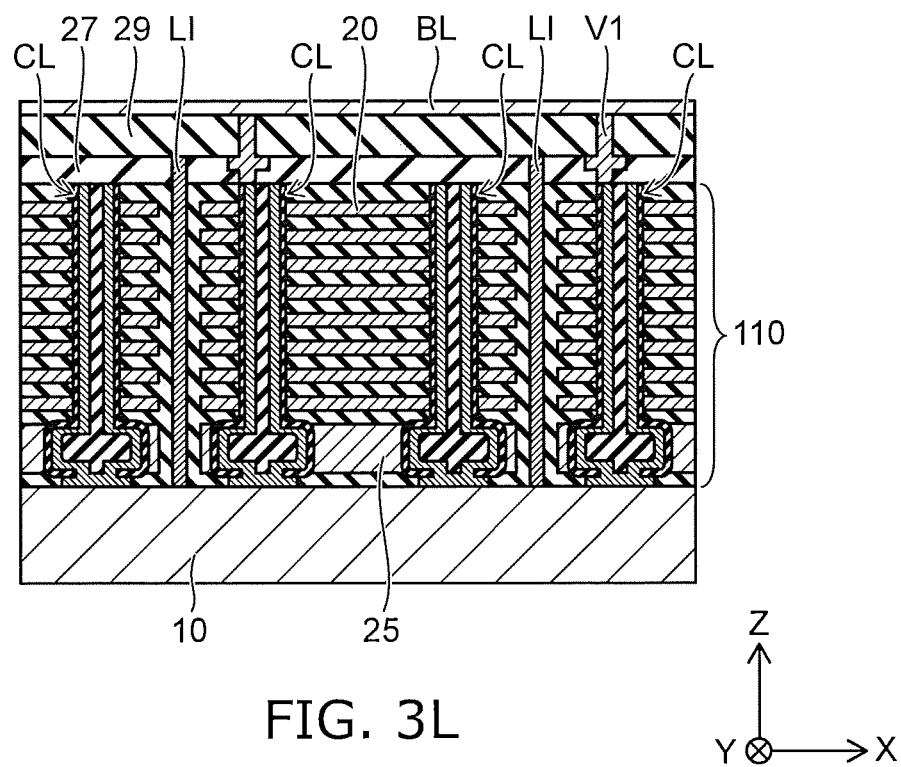

As shown in FIG. 3L, a source line SL (not shown) is formed on the insulating layer 27, and is electrically connected via contact plugs Cs to the source contact bodies LI (see FIG. 1). Moreover, an insulating layer 29 is formed to cover the insulating layer 27 and the source contact bodies LI, and bit lines BL are formed on the insulating layer, thus completing a memory cell part MCP of the semiconductor memory device 1.

In the embodiment, the electrode layer 25 acts as an etching stopper in the process of forming the memory holes MH (see FIG. 3B). Thereby, the depth controllability of the memory holes MH is improved, and it is possible to avoid the memory holes MH extending through the source layer 10 in the case where the source layer 10 has a thin thickness in the Z-direction, for example. Also, accuracy of the end positions of semiconductor layers 30 formed in the memory holes MH is improved by improving the depth controllability of the memory holes MH.

Figure 4:
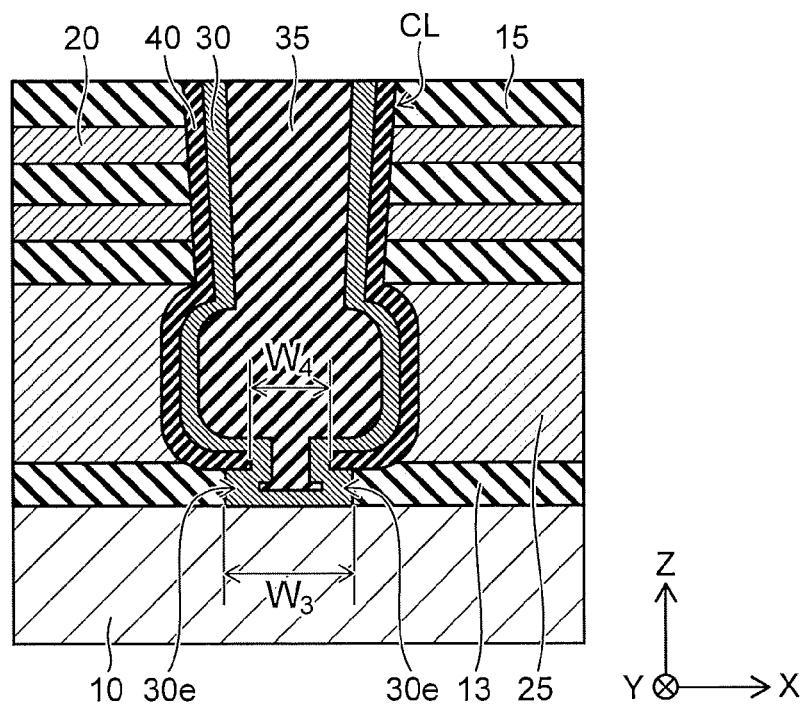
FIG. 4 is a schematic view showing a part of the cross section in the semiconductor memory device according to the first embodiment.

FIG. 4 is a schematic cross-sectional view showing a structure of bottom end portion in a columnar body CL. As shown in FIG. 4, the semiconductor layer 30 has, for example, a third width $W_3$ in the X-direction at the bottom end portion of the columnar body CL. In the embodiment, a part of the insulating layer 40 is removed, which is formed on the bottom surface of a memory hole MH, and subsequently, the source layer 10 is exposed by removing the part of the insulating layer 13 via an opening of the insulating layer 40 through the process shown in FIG. 3E. Furthermore, the bottom end portion of the memory hole is widened by etching the insulating layer 13 in a direction along the surface of the source layer 10 through the process shown in FIG. 3F. Thus, the third width $W_3$ of a portion 30e in the semiconductor layer 30, which is formed at the bottom end of the memory hole MH, is wider than a width $W_4$ of the opening in the insulating layer 40.

The widened bottom surface of the memory hole MH includes, for example, a surface that is suffered no damage while removing the parts of the insulating layers 40 and 13, for example, using anisotropic RIE. Thus, it is possible to reduce a contact resistance between the source layer 10 and the semiconductor layer 30.

Figure 5:
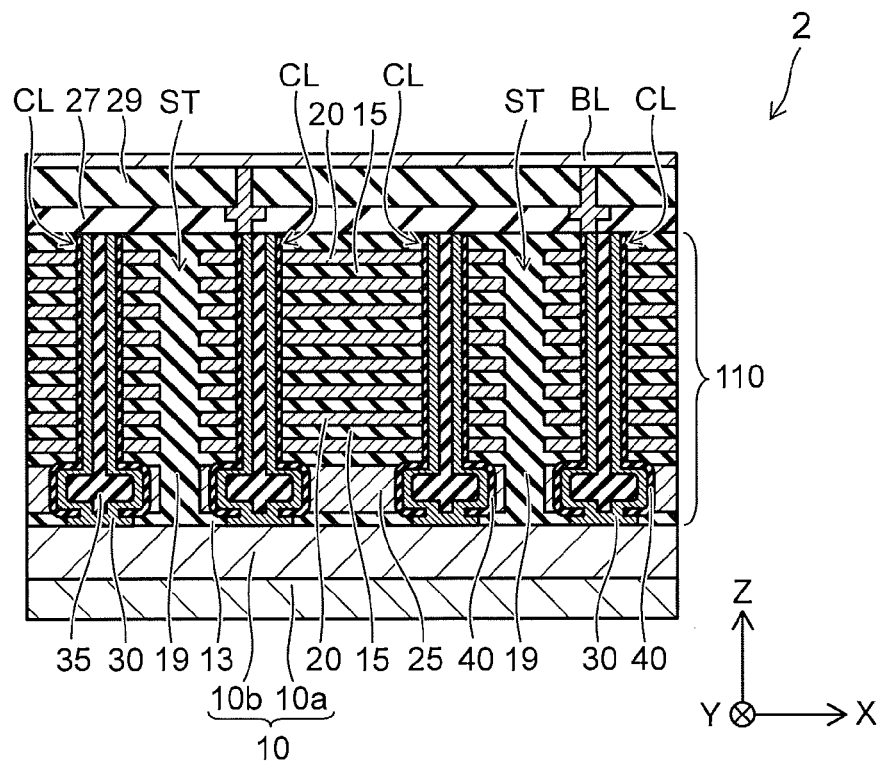
FIG. 5 is a schematic cross-sectional view showing a semiconductor memory device according to a variation of the first embodiment.

FIG. 5 is a schematic cross-sectional view showing a semiconductor memory device 2 according to a variation of the first embodiment. In the semiconductor memory device 2, the source layer 10 includes a first layer 10a and a second layer 10b. The second layer 10b is provided between the first layer 10a and the stacked body 100. The first layer 10a is, for example, a metal layer. The second layer 10b is, for example, a conductive silicon layer. The first layer 10a is provided, for example, on an interlayer insulating layer (not shown) that is provided on a substrate.

It is possible to reduce electric resistance of the source layer 10 in the X-direction and the Y-direction by using the metal layer for the first layer 10a. Thereby, the electrical connection of the source layer 10 to a source line SL is provided at a periphery of the memory cell part MCP without providing it through the slit spaces ST in the memory cell part MCP, for example. Thus, it is possible to reduce a width in the X-direction of each slit space ST, since there is no need for providing the source contact bodies LI in the slit spaces. Thereby, it is possible to increase the memory capacity of the semiconductor memory device 2 by making a size of the stacked body 100 enlarged.

Hereinafter, a manufacturing method according to a variation of the first embodiment is described with reference to FIGS. 6A to 6G. FIGS. 6A to 6G are schematic cross-sectional views illustrating a portion corresponding to a part of the cross section shown in FIG. 5, for example. In this example, a stacked body 120, which includes an electrode layer 50, is provided on the source layer 10. The electrode layer 50 is, for example, an N-type silicon layer including phosphorous (P) as an N-type impurity. Moreover, the source layer 10 includes the first layer 10a and the second layer 10b, but is not limited thereto. The source layer 10 may be a P-type well provided on a silicon substrate (not shown), for example.

As shown in FIG. 6A, the stacked body 120 is formed on the source layer 10. The stacked body 120 includes the same insulating layers 13, 15 and 17 as those in the stacked body 110 shown in FIG. 3A. The stacked body 120 further includes an electrode layer 50. The insulating layer 13 is formed on the second layer 10b of the source layer 10. The electrode layer 50 is formed on the insulating layer 13. The insulating layers 15 and the insulating layers 17 are alternately stacked on the electrode layer 50. The electrode layer 50 is, for example, an N-type silicon layer deposited using CVD.

As shown in FIG. 6B, a memory hole MH is formed from a top surface of the stacked body 120 to reach the electrode layer 50. For example, an etching mask 53 is formed on the stacked body 120, and then, the insulating layers 15 and the insulating layers 17 are selectively removed using anisotropic RIE. The memory hole MH is formed to have a bottom surface positioned in the electrode layer 50. The insulating layers 15 and 17 are removed under a condition where etching rates thereof are smaller than an etching rate of the electrode layer 50. Thereby, it is possible to set a thickness of the electrode layer 50 so that the etching is ended when proceeding into the electrode layer 50 through a stacked portion of the insulating layers 15 and the insulating layers 17. For example, a carbon layer is used for the etching mask 53.

As shown in FIG. 6C, the insulating layer 13 is exposed at a bottom surface of the memory hole MH by further etching the electrode layer 50. In this process, an etching condition is applied where the electrode layer 50 can be selectively removed with respect to the insulating layer 13. Then, the etching mask 53 is selectively removed using oxygen ashing.

As shown in FIG. 6D, a bottom portion of the memory hole MH is widened in the X-direction and the Y-direction by selectively etching the electrode layer 50 at the bottom portion of the memory hole MH. The electrode layer 50 is removed, for example, using CDE (Chemical Dry Etching).

As shown in FIG. 6E, an insulating layer 40 and a semiconductor layer 31 are sequentially formed to cover an inner surface of the memory hole MH and the top surface of the stacked body 120. These are formed, for example, using CVD in the same manner as the insulating layer 40 and the semiconductor layer 31 shown in FIG. 3D.

As shown in FIG. 6F, the semiconductor layer 31, the insulating layer 40 and insulating layer 13 is selectively removed in order at the bottom surface of the memory hole MH, and the second layer 10b is exposed. The semiconductor layer 31, the insulating layer 13 and the insulating layer 40 are removed, for example, using anisotropic RIE.

As shown in FIG. 6G, the bottom surface of the memory hole MH is widened in the X-direction and the Y-direction by selectively removing a part of the insulating layer 13. The insulating layer 13 is removed, for example, using wet etching, and thereby, it is possible to expose a surface of the second layer 10b, which is suffered no damage while the anisotropic RIE.

Subsequently, the columnar body CL and the stacked body 100 are completed through the process shown in FIGS. 3G to 3L. It should be noted that no source contact bodies LI are provided in the slit spaces ST in a case where the source layer 10 includes the first layer 10a and the second layer 10b.

Also in this example, the electrode layer 50 acts as an etching stopper while etching the stacked portion of the insulating layers 15 and the insulating layers 17 (see FIG. 6B). Thereby, the depth controllability of the memory hole MH is improved. Thus, in the case where the source layer 10 is formed with the first layer 10a and the second layer 10b, it is possible to make the second layer 10b have a thin thickness, and to reduce the manufacturing cost.

Hereinafter, a manufacturing process according to another variation of the first embodiment is described with reference to FIGS. 7A to 7D. FIGS. 7A to 7D are schematic cross-sectional views illustrating a portion corresponding to a part of the cross section shown in FIG. 5.

As shown in FIG. 7A, the stacked body 120 is formed on the source layer 10. The stacked body 120 includes the same insulating layers 13, 15 and 17 as those in the stacked body 120 shown in FIG. 6A. The stacked body 120 further includes an electrode layer 50. The electrode layer 50 is, for example, an N-type silicon layer, which is deposited using CVD, and includes phosphorus (P) as an impurity.

A memory hole MH is further formed from a top surface of the stacked body 120 to reach the electrode layer 50. For example, an etching mask 53 is formed on the stacked body 120, and the insulating layers 15 and the insulating layers 17 are selectively removed using anisotropic RIE. An etching condition is set in the anisotropic RIE based on a difference in etching rates between the insulating layers 15, 17 and the electrode layer 50 such that it becomes possible to end the etching when proceeding into the electrode layer 50. Thereby, the memory hole MH is formed to have a bottom surface positioned in the electrode layer 50.

As shown in FIG. 7B, the source layer 10 is exposed at the bottom of the memory hole MH by further etching the electrode layer 50 and the insulating layer 13. Then, the bottom portion of the memory hole MH is widened in the X-direction and the Y-direction by selectively etching the electrode layer 50 and the insulating layer 13 at the bottom portion of the memory hole MH.

As shown in FIG. 7C, an insulating layer 40 and a semiconductor layer 31 are sequentially formed to cover an inner surface of the memory hole MH and the top surface of the stacked body 120. These are formed, for example, using CVD in the same manner as the insulating layer 40 and the semiconductor layer 31 shown in FIG. 3D. Then, the source layer 10 is exposed at the bottom surface of the memory hole MH by selectively removing the semiconductor layer 31 and the insulating layer 40 in order. The semiconductor layer 31 and the insulating layer 40 are removed, for example, using anisotropic RIE.

As shown in FIG. 7D, the bottom surface of the memory hole MH is widened by selectively removing a part of the insulating layer 40. The insulating layer 40 is removed, for example, using wet etching, and thus, it is possible to expose a surface of the source layer 10 which is suffered no damage while the anisotropic RIE. Then, the columnar bodies CL and the stacked body 100 are completed through the process shown in FIGS. 3G to 3L.

Also in this example, the electrode layer 50 acts as an etching stopper while etching a stacked portion of the insulating layers 15 and the insulating layers 17 (see FIG. 7A). Thereby, the depth controllability of the memory hole MH is improved. Furthermore, it is possible to reduce contact resistance between the source layer 10 and the semiconductor layer 30, which provided in the memory hole, by partially removing the insulating layer 40 at the bottom portion of the memory hole MH and exposing the surface of the source layer 10 that is suffered no damage during the anisotropic RIE.

Second Embodiment

Figure 8:
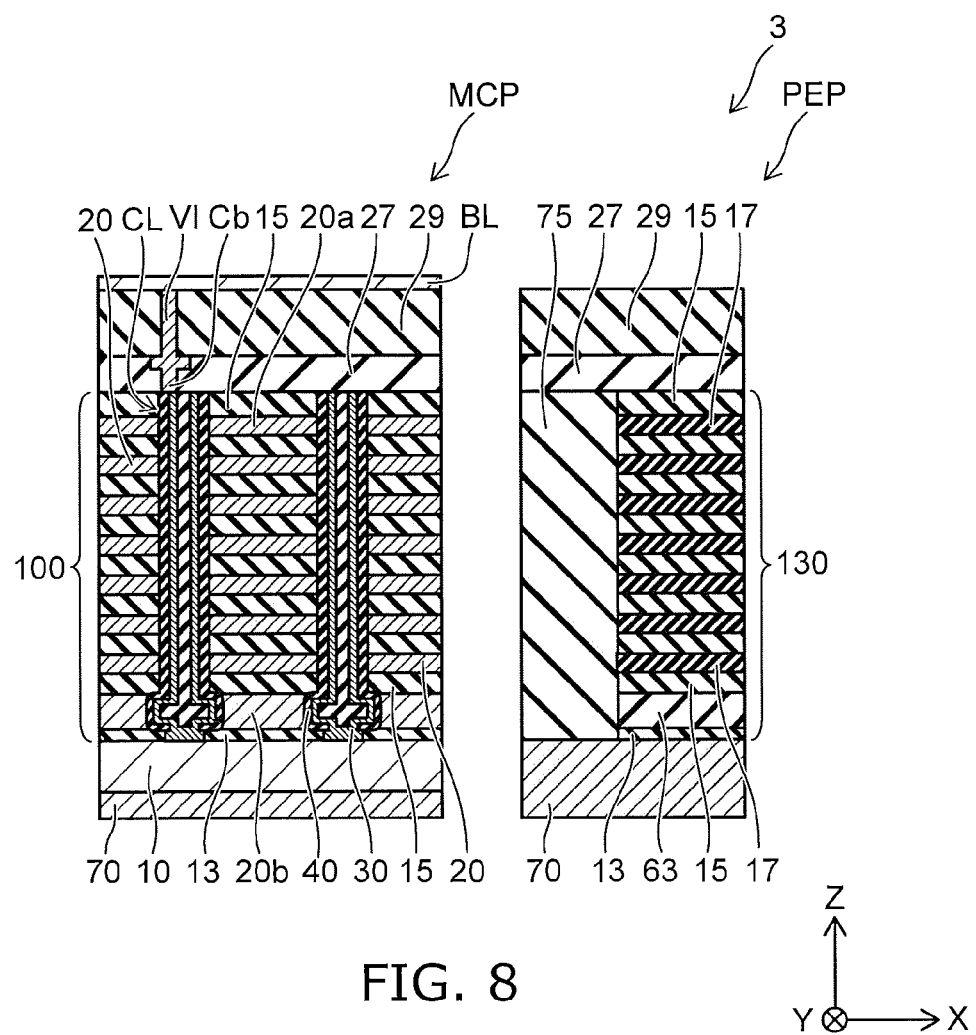
FIG. 8 is a schematic cross-sectional view showing a semiconductor memory device according to a second embodiment.

FIG. 8 is a schematic cross-sectional view showing a semiconductor memory device 3 according to a second embodiment. FIG. 8 is a schematic view showing a cross section taken along X-Z plane shown in FIG. 1. As shown in FIG. 8, the semiconductor memory device 3 includes a memory cell part MCP and a peripheral part PEP.

The memory cell part MCP includes a source layer 10, stacked body 100 and a plurality of columnar bodies CL. The source layer 10 is provided, for example, on an interlayer insulating layer 70. The interlayer insulating layer 70 is, for example, a silicon oxide layer. The source layer 10 includes, for example, a first layer 10a and a second layer 10b (see FIGS. 9C to 9H). It should be noted that the source layer 10 is not limited thereto, and may be, for example, a P-type silicon layer or a P-type well provided on a silicon substrate.

The stacked body 100 includes an insulating layer 13, a plurality of insulating layers 15 and a plurality of electrode layers 20. The insulating layer 13 is provided on the source layer 10. The insulating layers 15 and the electrode layers 20 are alternately stacked in the Z-direction on the insulating layer 13. The plurality of columnar bodies CL each extend in the Z-direction through the insulating layer 13, the plurality of electrode layers 20 and the plurality of insulating layers 15.

As shown in FIG. 8, the peripheral part PEP includes a stacked body 130. The stacked body 130 is provided on the interlayer insulating layer 70, and includes insulating layers 13, 15, 17 and 63. The insulating layer 13 is provided on the interlayer insulating layer 70. The insulating layer 63 is provided on the insulating layer 13. The insulating layers 15 and the insulating layers 17 are alternately stacked in the Z-direction on the insulating layer 63. The peripheral part PEP further includes an insulating layer 75 provided between the stacked body 100 and the stacked body 130.

The insulating layers 13, 15 are, for example, silicon oxide layers. The insulating layers 17 are, for example, silicon nitride layers. The insulating layer 63 is, for example, a layer including metal oxide or metal nitride. The insulating layer 63 includes, for example, at least one of aluminum oxide, aluminum nitride and aluminum oxynitride. It should be noted that a material of the insulating layer 63 is not limited thereto, and may be one that has an etching rate smaller than etching rates of a material used for the insulating layers 15 and the insulating layers 17 under the prescribed etching condition. Moreover, it is preferable to be a material having a resistivity against a temperature of thermal treatment, e.g. 1000 degree Celsius, in a subsequent manufacturing process.

Hereinafter, a manufacturing method of the semiconductor memory device 3 is described with reference to FIGS. 9A to 9J. FIGS. 9A to 9J are schematic cross-sectional views showing a manufacturing process of the semiconductor memory device 3 according to the embodiment.

Figure 9A:
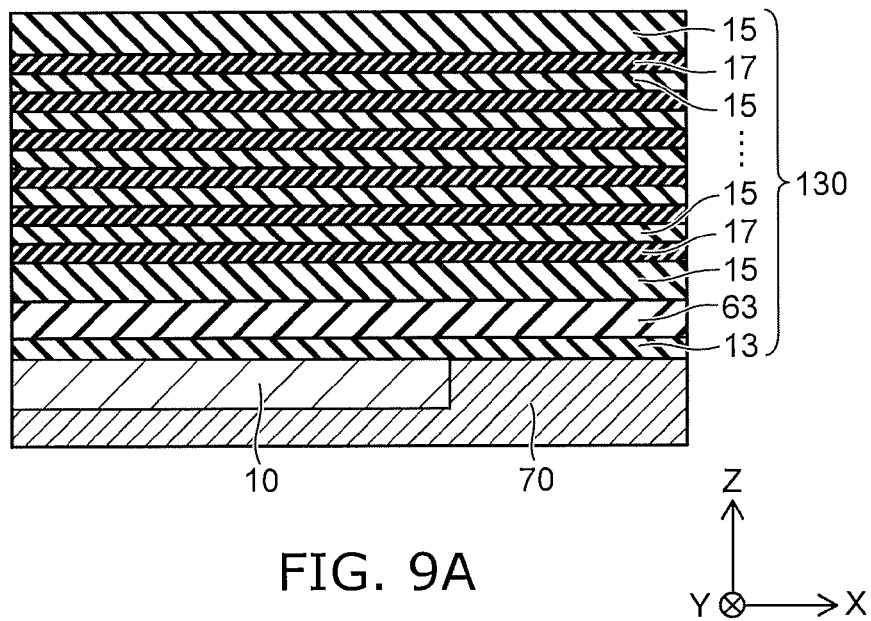

As shown in FIG. 9A, the stacked body 130 are formed on the source layer 10 and the interlayer insulating layer 70. The insulating layer 13, 15 are, for example, silicon oxide layers formed using CVD. The insulating layers 17 are, for example, silicon nitride layers formed using CVD. The insulating layer 63 is, for example, an aluminum oxide layer formed using CVD.

Figure 9B:
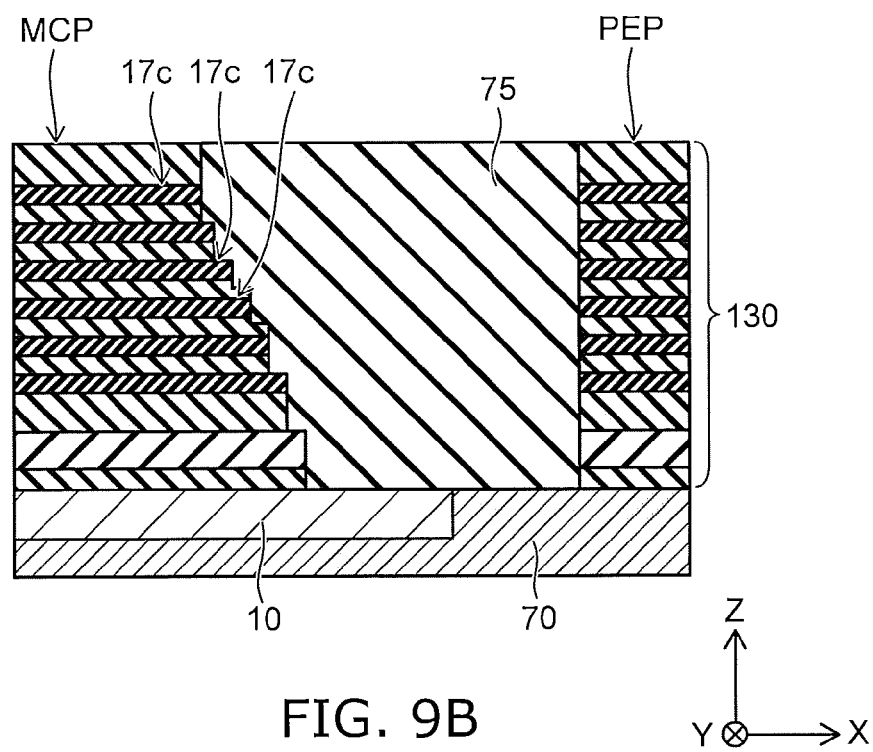

As shown in FIG. 9B, an insulating layer 75 is formed in the stacked body 130. The insulating layer 75 is embedded, for example, in a groove that divides the stacked body 130 into a memory cell part MCP and a peripheral part PEP. The insulating layers 17 have end parts 17e formed into stairs on the memory cell part MCP side. The insulating layer 75 is, for example, a silicon layer formed using CVD.

Following FIGS. 9C to 9H are schematic cross-sectional views showing a part of the stacked body 130 on the memory cell MCP side. As shown in FIGS. 9C to 9H, the source layer 10 includes a first layer 10a and a second layer 10b.

As shown in FIG. 9C, a memory hole MH is formed in the memory cell part MCP from a top surface of the stacked body 130 with a depth capable of reaching the insulating layer 63. The memory hole MH is formed by selectively removing the insulating layers 15 and the insulating layers 17 using an etching mask formed on the top surface of the stacked body 130. The memory hole MH is formed, for example, using anisotropic RIE. The etching mask 53 is selectively removed after the memory hole MH is formed.

The insulating layers 15 and 17 are selectively removed under a condition where etching rates thereof are larger than an etching rate of the insulating layer 63. Thereby, the insulating layer 63 acts as an etching stopper, and the memory hole MH is formed to have a bottom surface positioned in the insulating layer 63. Thus, the depth of the memory hole MH is easily controlled.

As shown in FIG. 9D, a bottom portion of the memory hole MH is widened in the X-direction and the Y-direction by selectively etching the insulating layer 63. Thereby, it is possible to avoid occlusion at the bottom portion of the memory hole MH, and to keep a space for forming an insulating layer 30. The insulating layer 63 is removed, for example, using CDE. The insulating layer 13 is exposed at the bottom surface of the memory hole MH.

As shown in FIG. 9E, an insulating layer 40 and a semiconductor layer 31 are formed to cover the inner surface of the memory hole MH and the top surface of the stacked body 130. The insulating layer 40 has a structure, for example, in which a silicon oxide layer, a silicon nitride layer and another silicon oxide layer are stacked in order. The semiconductor layer 31 is, for example, a silicon layer formed using CVD.

Figure 9F:
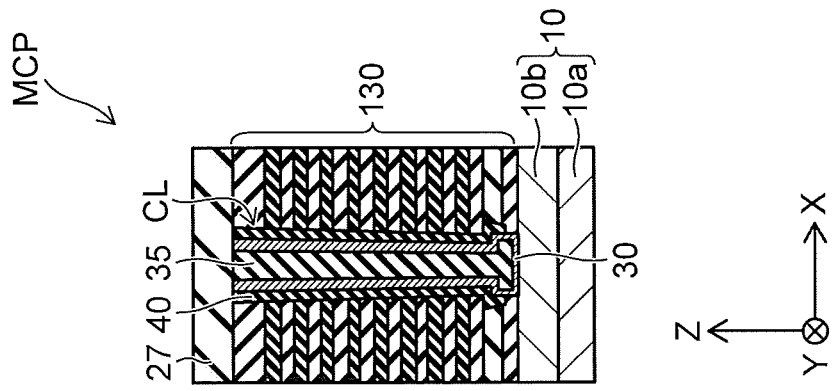

As shown in FIG. 9F, the semiconductor layer 31, the insulating layer 40 and the insulating layer 13 are selectively removed at the bottom surface of the memory hole MH to expose the second layer 10b. The semiconductor layer 31 and the insulating layer 40 are selectively removed, for example, using anisotropic RIE so that parts of the semiconductor layer 31 and the insulating layer 40 remain on the inner wall of the memory hole MH. Other parts of the semiconductor layer 31 and the insulating layer 40, which are formed on the top surface of the stacked body 130, are protected, for example, by selectively forming a silicon nitride layer and like thereon.

Figure 9G:
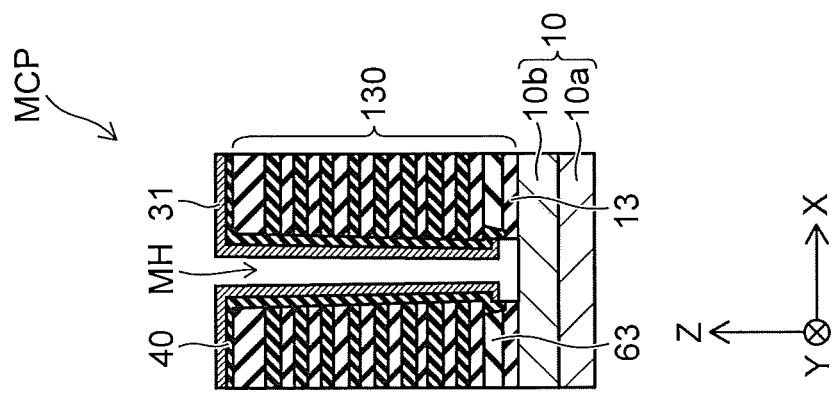

As shown in FIG. 9G, the bottom surface of the memory hole MH is widened in the X-direction and the Y-direction by selectively removing a part of the insulating layer 13. The part of the insulating layer 13 is removed, for example, using wet etching. Thereby, it is possible to expose a part of the second layer 10b that is suffered no damage during the anisotropic RIE.

Figure 9H:
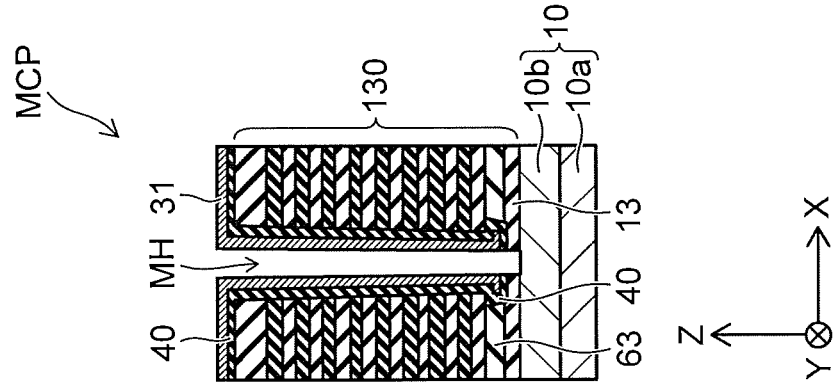

As shown in FIG. 9H, a semiconductor layer 30 and a core body 35 are formed in the memory hole MH to complete a columnar body CL. The semiconductor layer 30 is formed, for example, by forming a silicon layer on the semiconductor layer 31. The core body 35 is formed, for example, by embedding silicon oxide in the memory hole MH. The semiconductor layer 30 is in contact with the second layer 10b at the bottom surface of the memory hole MH. Thus, it is possible to reduce contact resistance at an interface between the second layer 10b and the semiconductor layer 30 by making the semiconductor layer 30 contact the surface that is suffered no damage by the anisotropic RIE.

Figure 9I:
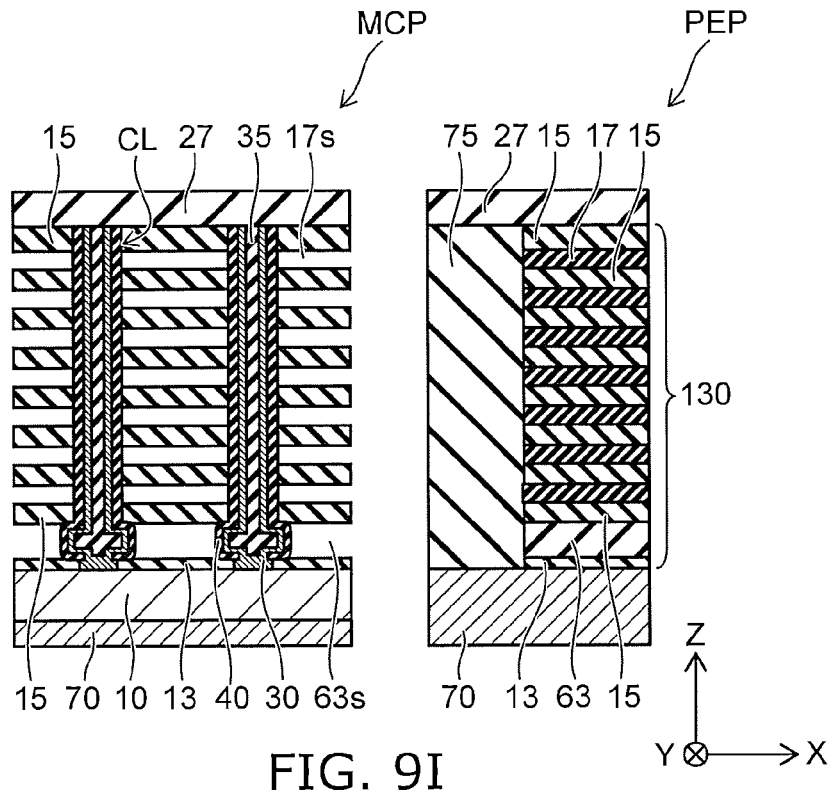

As shown in FIG. 9I, the insulating layers 17 and the insulating layer 63 are selectively removed in the memory cell part MCP by supplying etching liquid through slit spaces ST (see FIG. 1) that divide the stacked body 130. For example, in a case where the insulating layers 13 and 15 are silicon oxide layers, and the insulating layers 17 are silicon nitride layers, it is possible to selectively remove the insulating layers 17 and the insulating layer 63 by supplying hot phosphoric acid as the etching liquid. In this process, the insulating layer 40 in the columnar body CL has resistivity against the etching liquid.

The etching liquid is not supplied in the peripheral part PEP, since the slit spaces ST is not formed in the peripheral part PEP. Thus, parts of the insulating layers 17 and the insulating layer 63 remain in the stacked body 130 at the peripheral part PEP.

Figure 9J:
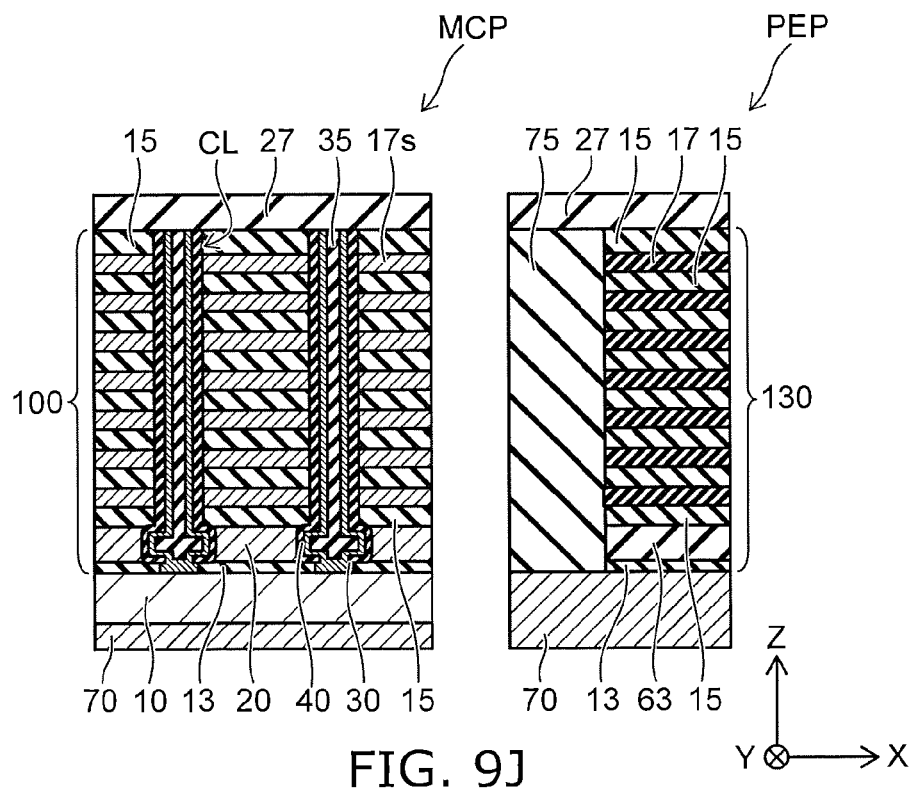

As shown in FIG. 9J, electrode layers 20 are formed in spaces 17s and 63s respectively to complete the stacked body 100. The spaces 17s are formed by removing the insulating layers 17, and the space 63s is formed by removing the insulating layer 63. For example, metal layers, which are to be the electrode layers 20, are deposited in the spaces 63s and 17s, for example, using CVD. The electrode layers 20 each include, for example, barrier metal and high-melting-point metal.

Then, after the insulating layers 19, 27 and the source line SL are formed, an insulating layer 29 and bit lines BL (see FIGS. 3K and 3L) are formed to complete a memory cell part MCP of the semiconductor memory device 3. The insulating layers 19 are embedded in the slit spaces ST.

Also in this example, it is possible to improve the depth controllability of the memory hole MH by using the insulating 63 as the etching stopper. Moreover, it is possible to avoid occlusion in the memory hole MH by partially removing the insulating layer 63 and widening the bottom portion of the memory hole MH. Furthermore, it is possible to reduce the contact resistance between the semiconductor layer 30 and the source layer 10 by partially removing the insulating layer 13 and widening the bottom surface of the memory hole MH.

Third Embodiment

Figure 10:
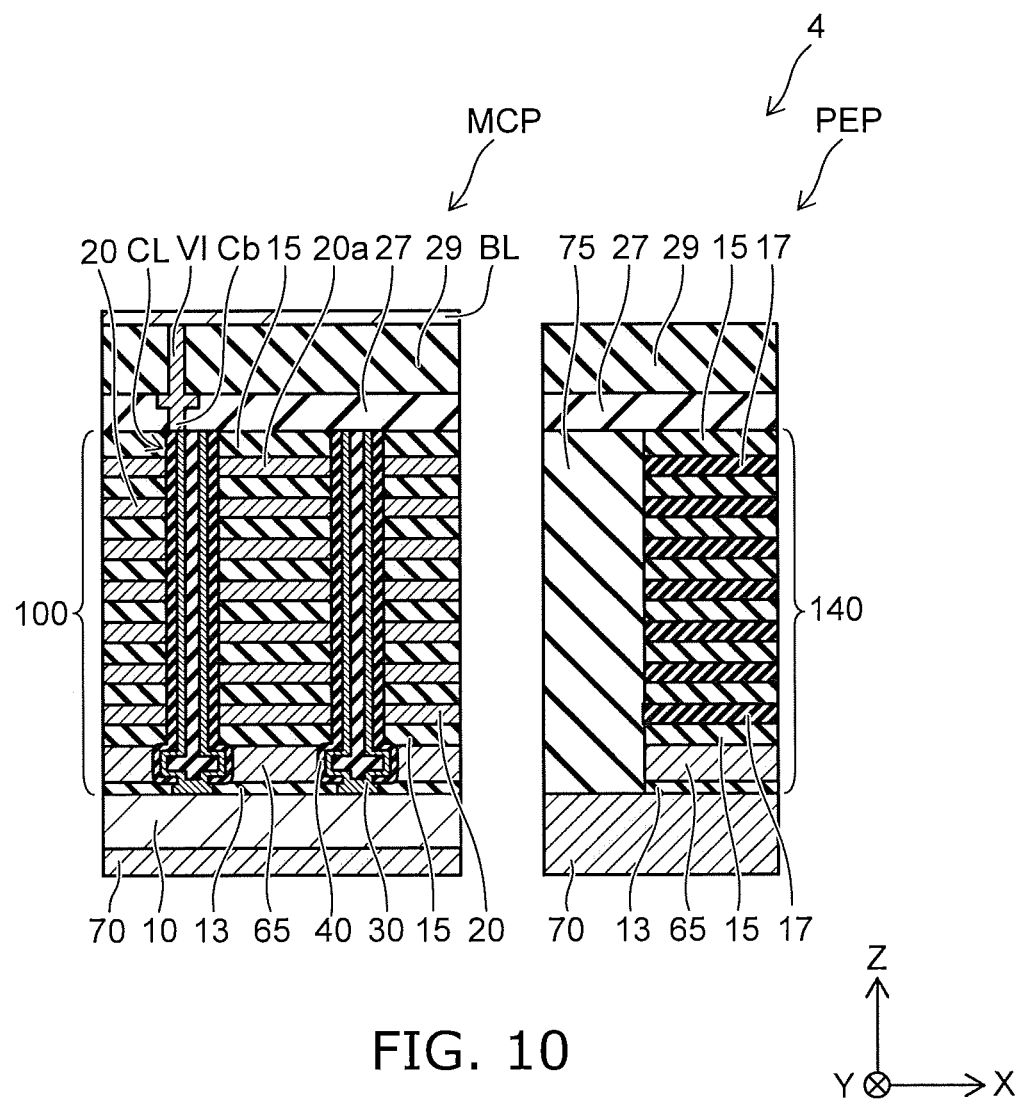
FIG. 10 is a schematic cross-sectional view showing a semiconductor memory device according to a third embodiment.

FIG. 10 is a schematic view showing a semiconductor memory device 4 according to a third embodiment. FIG. 10 is a schematic view showing a cross section taken along the X-Z plane. As shown in FIG. 10, the semiconductor memory device 4 includes a memory cell part MCP and a peripheral part PEP.

The memory cell part MCP includes a stacked body 100 and a plurality of columnar bodies CL. The stacked body 100 is provided on the source layer 10. The source layer 10 is provided, for example, on an interlayer insulating layer 70. The source layer 10 includes, for example, a first layer 10a and a second layer 10b (see FIGS. 11C to 11E). It should be noted that the source layer 10 is not limited to this, and it may be, for example, a P-type silicon layer or a P-type well provided in a silicon substrate.

The stacked body 100 includes insulating layers 13, 15, and electrode layers 20 and 60. The electrode layer 65 is provided on the source layer with the insulating layer 13 interposed. The insulating layer 15 and the electrode layers 20 are alternately stacked on the electrode layer 65.

The plurality of columnar bodies CL each extend in the Z-direction through the insulating layer 13, the electrode layer 65, the insulating layers 15 and the electrode layers 20. The columnar bodies CL each include a semiconductor layer 30, a core body 35 and an insulating layer 40.

The peripheral part PEP includes a stacked body 140 provided on the interlayer insulating layer 70. The stacked body 140 includes insulating layers 13, 15, 17 and electrode layer 65. The electrode layer 65 is provided on the interlayer insulating layer 70 with the insulating layer 13 interposed. The insulating layers 15 and the insulating layers 17 are alternately stacked in the Z-direction on the electrode layer 65. Moreover, an insulating layer 75 is provided between the stacked body 100 in the memory cell part MCP and the stacked body 140.

The electrode layer 65 includes, for example, at least one of tungsten (W) and tungsten silicide (WSi). It should be noted that a material of the electrode layer 65 is not limited thereto, and it may be a conductive member that has a smaller etching rate under a prescribed etching condition than an etching rate of materials used for the insulating layers 15 and the insulating layers 17. Moreover, it is preferable to be a material that is sustainable under a temperature of thermal treatment, for example, 1000 degree Celsius in a manufacturing process of the semiconductor memory device 4.

Hereinafter, a manufacturing method of the semiconductor memory device 4 is described with reference to FIGS. 11A to 11E. FIGS. 11A to 11E are schematic cross-sectional views showing a manufacturing process of the semiconductor memory device 4.

Figure 11A:
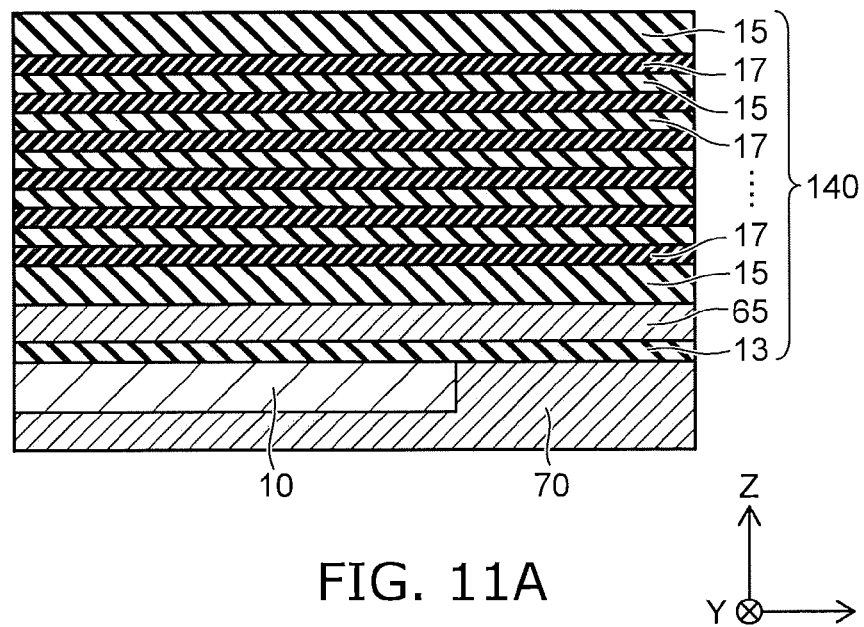
FIGS. 11A to 11E are schematic cross-sectional views showing a manufacturing process of the semiconductor memory device according to the third embodiment.

As shown in FIG. 11A, a stacked body 140 is formed on a source layer 10 and an interlayer insulating layer 70. The stacked body 140 includes insulating layers 13, 15, 17 and an electrode layer 65. The insulating layers 13 and 15 are, for example, silicon oxide layers. The insulating layers 17 are, for example, silicon nitride layers. The electrode layer 65 is, for example, a tungsten layer or a tungsten silicide layer formed using CVD.

Figure 11B:
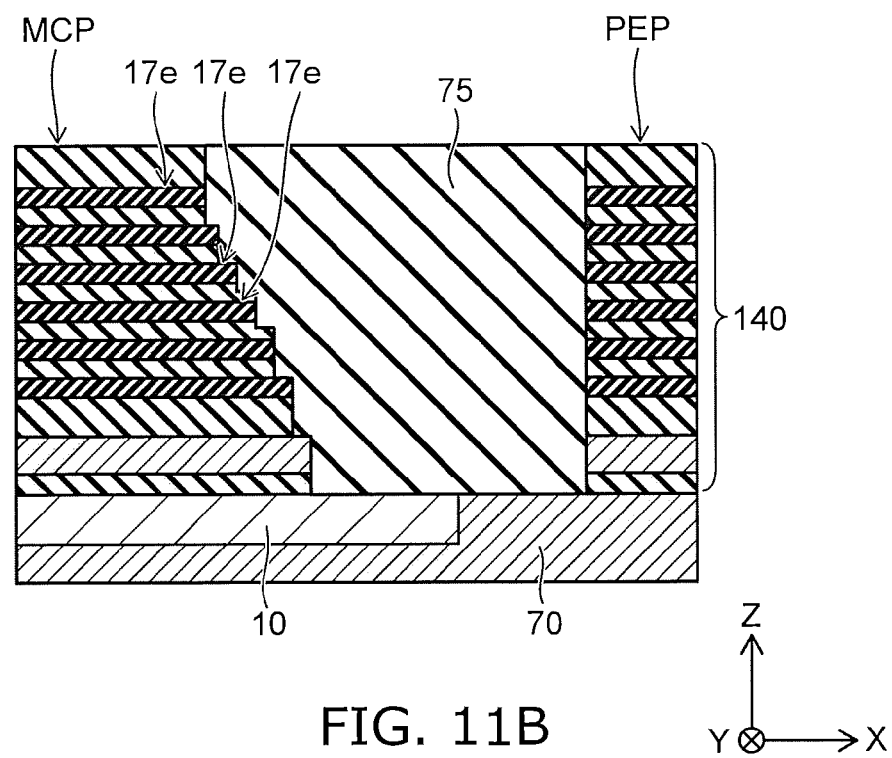

As shown in FIG. 11B, an insulating layer 75 is formed in the stacked body 140. The insulating layer 75 is embedded, for example, in a groove which divides the stacked body 140 into the memory cell part MCP and the peripheral part PEP. The insulating layer 75 covers end portions 17e of the insulating layers 17 on the memory cell part MCP side, which are formed into stairs. The insulating layer 75 is, for example, a silicon oxide layer formed using CVD.

Figure 11C:
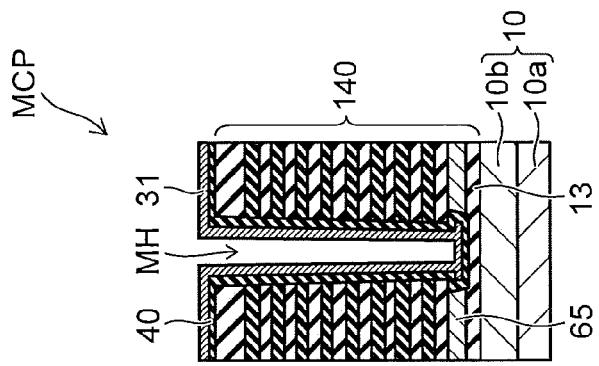
Figure 11D:
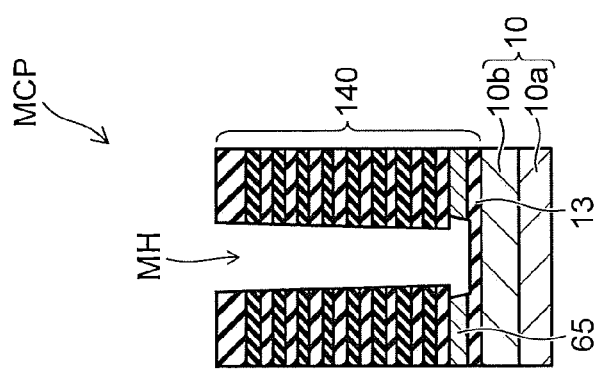
Figure 11E:
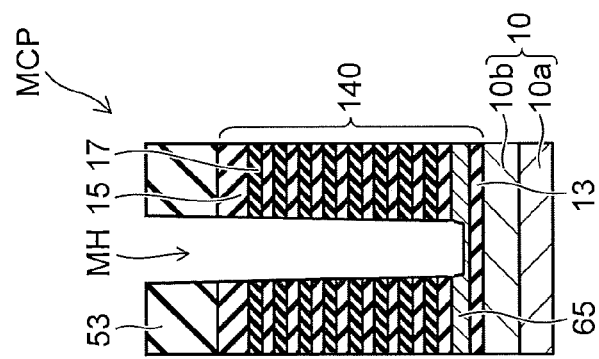

As described below, FIGS. 11C to 11E are schematic cross-sectional views showing a part of the stacked body 140 on the memory cell part MCP side. As shown in FIGS. 11C to 11E, the source layer 10 includes a first layer 10a and a second layer 10c.

As shown in FIG. 11C, a memory hole MH is formed in the memory cell part MCP from a top surface of the stacked body 140 with a depth capable of reaching the electrode layer 65. The memory hole MH is formed by selectively removing the insulating layers 15 and 17 using an etching mask 53 and anisotropic RIE, for example. The etching of insulating layers 15 and 17 are performed under a condition where etching rates of the insulating layers 15 and 17 is smaller than an etching rate of the electrode layer 65 such that the etching can be ended when a bottom surface of the memory hole MH proceeds into the electrode layer 65.

As shown in FIG. 11D, a bottom portion of the memory hole MH are widened in the X-direction and the Y-direction by partially removing the electrode layer 65. The electrode layer 65 can be selectively removed, for example, using wet etching.

As shown in FIG. 11E, an insulating layer 40 and a semiconductor layer 31 are formed to cover an inner surface of the memory hole MH and the top surface of the stacked body 140. The insulating layer 40 has a structure, for example, in which a silicon oxide layer, a silicon nitride layer and another silicon oxide layer are stacked in order. The semiconductor layer 31 is, for example, a silicon layer formed using CVD.

Then, the memory cell part MCP of the semiconductor memory device 4 is completed through a process showing in FIG. 9F and following Figures. A structure of the stacked body 140 remains in the peripheral part PEP, which includes parts of the insulating layers 17 and the electrode layer 65.

In the embodiment, it is also possible to improve a depth controllability of the memory hole MH by using the electrode layer 65 as an etching stopper. Moreover, the bottom portion of the memory hole MH is widened by partially removing the electrode layer 65, and thereby, it is possible to avoid occlusion in the memory hole MH when forming the insulating layer 40.

Fourth Embodiment

Figure 12:
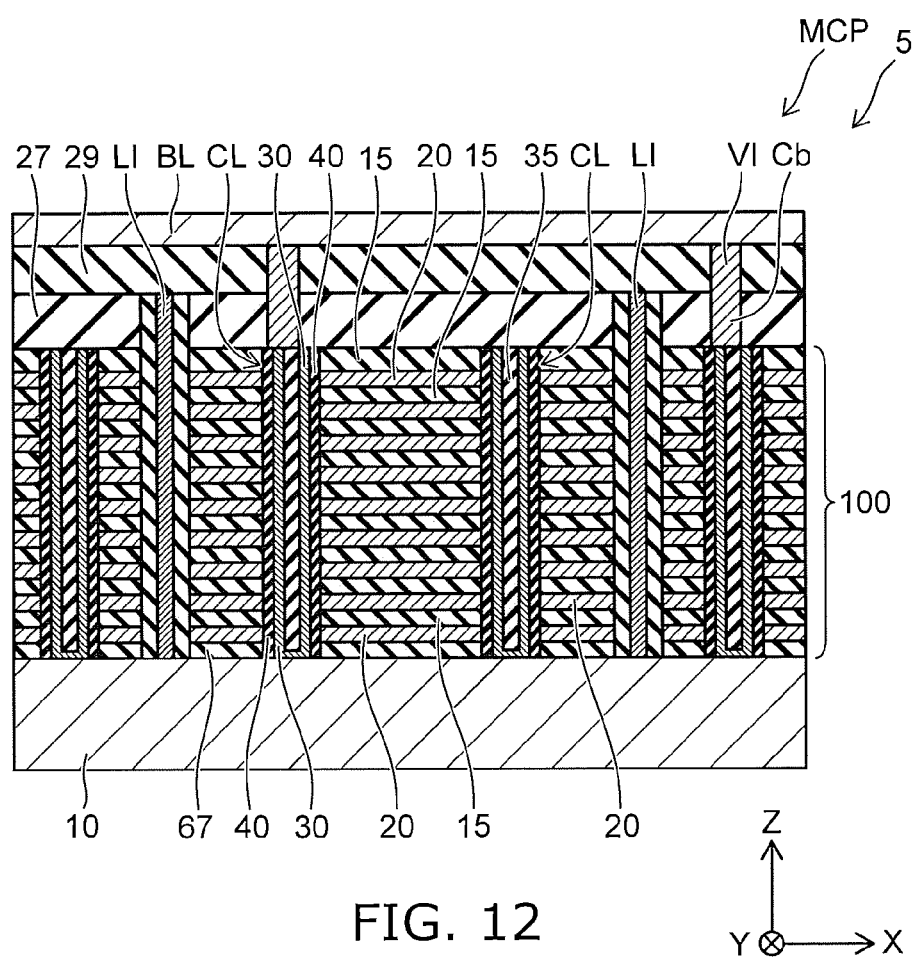
FIG. 12 is a schematic cross-sectional view showing a semiconductor memory device according to a fourth embodiment.

FIG. 12 is a schematic cross-sectional view showing a memory cell part MCP of a semiconductor memory device 5 according to fourth embodiment. FIG. 12 is a schematic view showing a cross section taken along the X-Z plane.

The semiconductor memory device 5 includes a stacked body 100 and columnar bodies CL. The stacked body 100 is provided on the source layer 10 in the memory cell part MCP. The stacked body 100 includes an insulating layer 67, insulating layers 15 and electrode layers 20. The insulating layer 67 is provided on a source layer 10, and the insulating layers 15 and the electrode layers 20 are alternately stacked on the insulating layer 67. The insulating layer 67 includes, for example, at least one of tantalum oxide, titanium oxide, zirconium oxide, hafnium oxide, and boron nitride. The electrode layer 20 includes metal such as tungsten.

The columnar bodies CL each include a semiconductor layer 30, a core body 35 and an insulating layer 40, and extend in the Z-direction through the stacked body 100. The semiconductor layer 30 extends in the Z-direction, and is electrically connected to the source layer 10 at a bottom end thereof.

Hereinafter, a manufacturing method of the semiconductor memory device is described with reference to FIGS. 3A to 13D. FIGS. 13A to 13D are schematic cross-sectional views showing a manufacturing process of the semiconductor memory device 5 according to the embodiment.

Figure 13A:
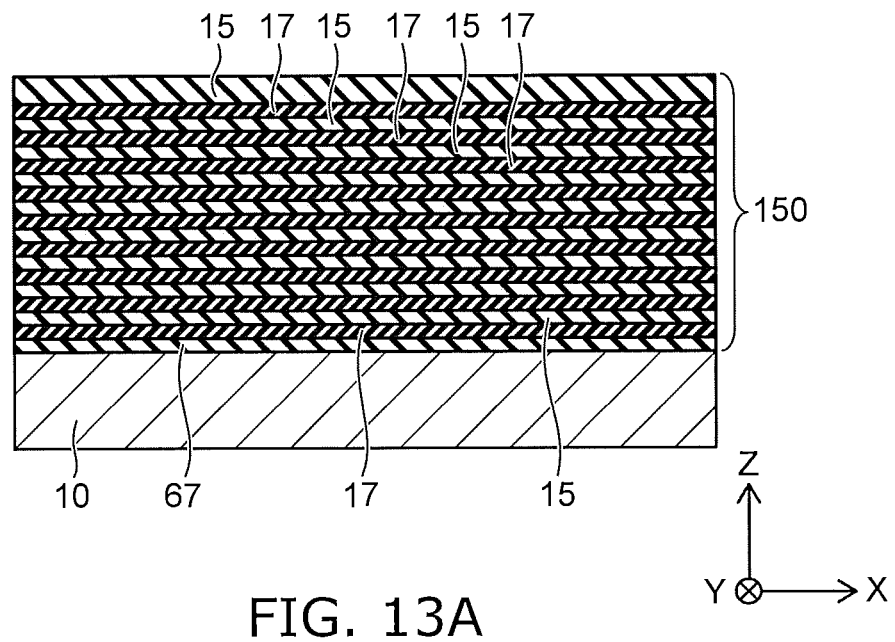
FIGS. 13A to 13D are schematic cross-sectional views showing a manufacturing process of the semiconductor memory device according to the fourth embodiment.

As shown in FIG. 13A, a stacked body 150 is formed on a source layer 10. The stacked body 150 includes insulating layers 15, insulating layers 17 and an insulating layer 67. The insulating layer 67 is formed on the source layer 10. The insulating layers 15 and the insulating layers 17 are alternately stacked on the insulating layer 67.

The insulating layer 67 is formed using a material which has a smaller etching rate under a prescribed etching condition than etching rates of the insulating layers 15 and 17. The insulating layer 67 includes at least one of tantalum oxide, titanium oxide, zirconium oxide, hafnium oxide and boron nitride, which are formed, for example, using a sputtering method or a CVD method. The insulating layers 15 are, for example, silicon oxide layers. The insulating layers 17 are, for example, silicon nitride layers. The insulating layers 15 and 17 are formed, for example, using CVD.

Figure 13B:
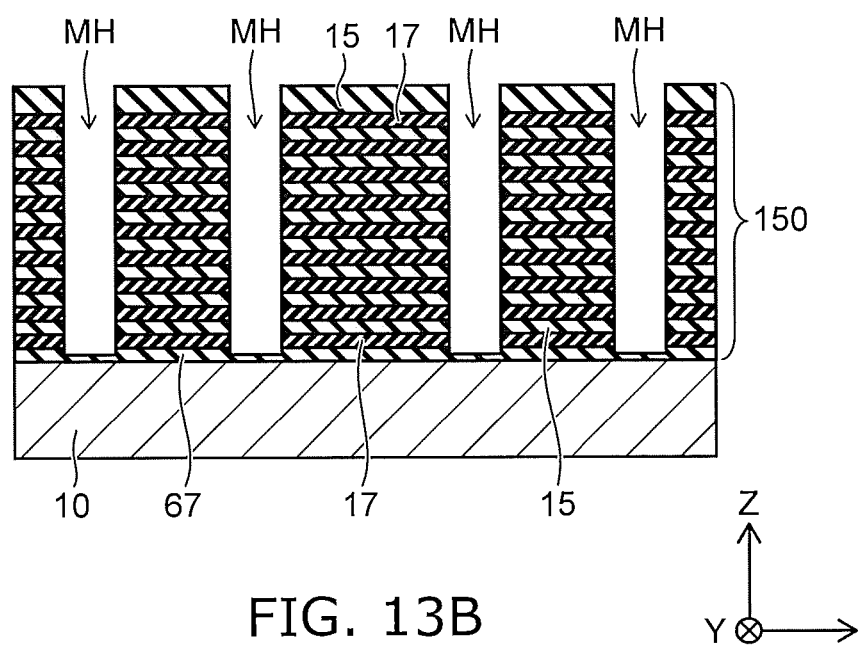

As shown in FIG. 13B, memory holes MH are formed from a top surface of the stacked body 150 with a depth capable of reaching the insulating layer 67. The memory holes MH are formed by selectively removing the insulating layers 15 and 17 using anisotropic RIE, for example. Etching of insulating layers 15 and 17 is performed under a condition where etching rates thereof is larger than an etching rate of the insulating layer 67, and is ended when bottom surfaces of the memory holes MH reach the insulating layer 67. That is, the insulating layer 67 acts as an etching stopper layer so as to improve depth controllability of the memory holes MH.

Figure 13C:
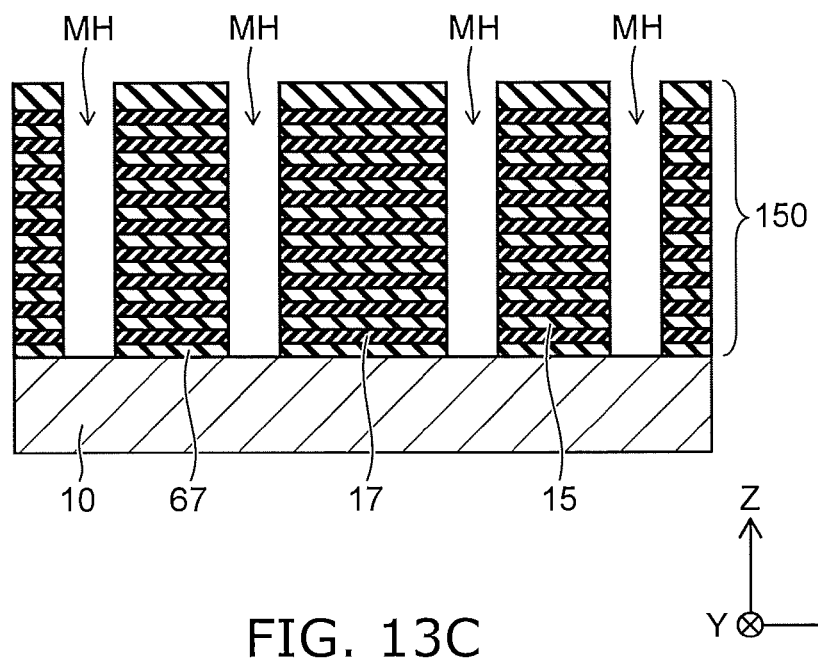

As shown in FIG. 13C, the insulating layer 67 is selectively etched to expose the source layer 10 at bottom surfaces of the memory holes MH. The etching of the insulating layer 67 is performed under a condition where the insulating layer 67 is selectively removed with respect to the insulating layers 15 and 17. The insulating layer 67 is etched, for example, using wet etching.

Figure 13D:
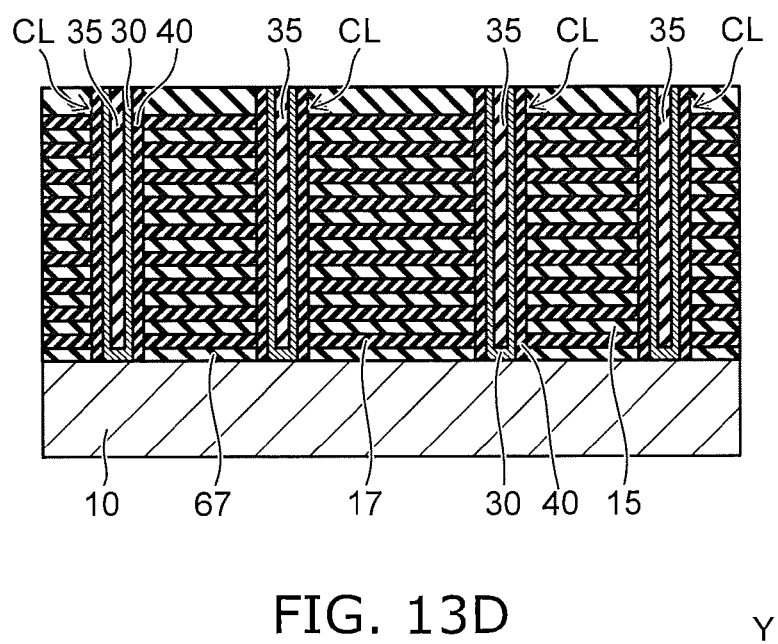

As shown in FIG. 13D, insulating layers 40 and semiconductor layers 31 are formed on the inner surfaces of the memory holes MH, and then, core bodies 35 are embedded in the memory holes MH to complete columnar bodies CL. Subsequently, the insulating layers 17 are replaced with metal layers to form electrode layers 20, and then, the stacked body 100 is completed. Further, source contact bodies LI, a source line SL (see FIG. 1) and bit lines BL are formed to complete the memory cell part MCP of the semiconductor memory device 5.

According to the embodiment, it is possible to improve the depth controllability of the memory holes MH by the insulating layer acting as an etching stopper layer. Moreover, it is also possible to improve controllability of bottom end positions of the semiconductor layers 30 formed in the memory holes MH.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
    a first electrode layer provided above a conductive layer;
    a second electrode layer provided between the conductive layer and the first electrode layer;
    a first insulating layer provided between the first electrode layer and the second electrode layer;
    a second insulating layer provided between the conductive layer and the second electrode layer; and
    a pillar layer extending through the first electrode layer, the second electrode layer, the first insulating layer, and the second insulating layer in a first direction directed from the conductive layer to the first electrode layer, the pillar layer having conductivity,
    the pillar layer including a first portion extending through the first insulating layer, a second portion extending through the second electrode layer, and a third portion extending through the second insulating layer, and
    the pillar layer having a first width in a second direction along a surface of the conductive layer at a periphery of the first portion, a second width in the second direction at a periphery of the second portion, and a third width in the second direction at a periphery of the third portion, wherein
    the second width is larger than the first width, and
    the third width is larger than the first width and narrower than the second width.

2. The semiconductor memory device according to claim 1, wherein
    the first electrode layer includes metal, and the second electrode layer includes semiconductor.

3. The semiconductor memory device according to claim 2, wherein the second electrode layer includes silicon.

4. The semiconductor memory device according to claim 1, wherein the second electrode layer has a thickness in the first direction larger than a thickness of the first electrode layer.

5. The semiconductor memory device according to claim 1, further comprising:
    a peripheral part arranged in the second direction with the first electrode layer and the second electrode layer, the peripheral part including a first layer, second layers and third layers, the second layers and the third layers being alternately stacked in the first direction on the first layer, wherein
    an etching rate of the first layer under a prescribed etching condition is smaller than etching rates of the second layers and the third layers.

6. The semiconductor memory device according to claim 5, wherein the first layer includes metal oxide, and the second layers and the third layers are insulating layers including silicon.

7. The semiconductor memory device according to claim 6, wherein the first layer includes aluminum oxide.

8. The semiconductor memory device according to claim 5, wherein the first layer is a metal layer, and the second layers and the third layers are insulating layers including silicon.

9. The semiconductor memory device according to claim 5, wherein the first layer includes a material same as a material of the second electrode layer.

* * * * *